(12) United States Patent
Otsuka

(10) Patent No.: US 11,189,586 B2
(45) Date of Patent: *Nov. 30, 2021

(54) SEMICONDUCTOR DEVICE AND FABRICATION METHOD OF THE SEMICONDUCTOR DEVICE

(71) Applicant: ROHM CO., LTD., Kyoto (JP)

(72) Inventor: Takukazu Otsuka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/925,017

(22) Filed: Jul. 9, 2020

(65) Prior Publication Data

US 2020/0343208 A1    Oct. 29, 2020

Related U.S. Application Data

(63) Continuation of application No. 16/136,988, filed on Sep. 20, 2018, now Pat. No. 10,790,247, which is a
(Continued)

(30) Foreign Application Priority Data

Apr. 19, 2016    (JP) .................................. 2016-083634

(51) Int. Cl.
*H01L 23/00*        (2006.01)
*H01L 29/739*       (2006.01)
(Continued)

(52) U.S. Cl.
CPC .......... *H01L 24/08* (2013.01); *H01L 23/3735* (2013.01); *H01L 23/4952* (2013.01);
(Continued)

(58) Field of Classification Search
None
See application file for complete search history.

(56) References Cited

U.S. PATENT DOCUMENTS 10,790,247 B2 *   9/2020   Otsuka ................ H01L 29/7802
2008/0017907 A1 * 1/2008   Otremba ................. H01L 28/40
                                                257/306
(Continued)

FOREIGN PATENT DOCUMENTS

DE      112015002815 T5    3/2017
JP      2000-100849 A      4/2000
(Continued)

OTHER PUBLICATIONS

Office Action issued in the counterpart German patent application No. 11 2017 002 080.8, dated Dec. 20, 2019, 12 pages including English translation.

*Primary Examiner* — Alexander G Ghyka
(74) *Attorney, Agent, or Firm* — Hamre, Schumann, Mueller & Larson, P.C.

(57) ABSTRACT

A semiconductor device includes: a semiconductor chip; and an Ag fired cap formed so as to cover a source pad electrode formed on the semiconductor chip. The semiconductor chip is disposed on a first substrate electrode, and one end of a Cu wire is bonded onto the Ag fired cap by means of an ultrasonic wave. There is provided a semiconductor device capable of improving a power cycle capability, and a fabrication method of such a semiconductor device.

17 Claims, 24 Drawing Sheets

Related U.S. Application Data continuation of application No. PCT/JP2017/015306, filed on Apr. 14, 2017.

(51) Int. Cl.
| | | |
|---|---|---|
| *H01L 29/78* | (2006.01) | |
| *H01L 23/495* | (2006.01) | |
| *H01L 29/417* | (2006.01) | |
| *H01L 25/07* | (2006.01) | |
| *H01L 23/373* | (2006.01) | |
| *H01L 29/12* | (2006.01) | |
| *H01L 29/161* | (2006.01) | |
| *H01L 29/41* | (2006.01) | |

(52) U.S. Cl.
CPC ........ *H01L 23/49524* (2013.01); *H01L 24/03* (2013.01); *H01L 24/48* (2013.01); *H01L 24/85* (2013.01); *H01L 25/072* (2013.01); *H01L 29/12* (2013.01); *H01L 29/161* (2013.01); *H01L 29/41* (2013.01); *H01L 29/417* (2013.01); *H01L 29/739* (2013.01); *H01L 29/78* (2013.01); *H01L 24/45* (2013.01); *H01L 2224/08501* (2013.01); *H01L 2224/40* (2013.01); *H01L 2224/45124* (2013.01); *H01L 2224/45147* (2013.01); *H01L 2224/45565* (2013.01); *H01L 2224/45624* (2013.01); *H01L 2224/48091* (2013.01); *H01L 2224/48624* (2013.01); *H01L 2224/48647* (2013.01); *H01L 2224/85205* (2013.01); *H01L 2924/13055* (2013.01)

(56) References Cited

U.S. PATENT DOCUMENTS

| | | | |
|---|---|---|---|
| 2009/0001570 A1 | 1/2009 | Yamano | |
| 2015/0325502 A1* | 11/2015 | Andou | H01L 21/56 |
| | | | 438/14 |
| 2016/0148852 A1* | 5/2016 | Takahashi | H01L 23/053 |
| | | | 257/698 |
| 2016/0315039 A1* | 10/2016 | Yilmaz | H01L 21/4825 |
| 2017/0092596 A1 | 3/2017 | Yoshihara | |
| 2017/0345792 A1 | 11/2017 | Tanimoto | |

FOREIGN PATENT DOCUMENTS

| | | |
|---|---|---|
| JP | 2009-4544 A | 1/2009 |
| JP | 2009-179825 A | 8/2009 |
| JP | 2014-82367 A | 5/2014 |
| JP | 2016-4796 A | 1/2016 |

\* cited by examiner

SEMICONDUCTOR DEVICE AND FABRICATION METHOD OF THE SEMICONDUCTOR DEVICE

CROSS REFERENCE TO RELATED APPLICATIONS

This is a continuation application (CA) of PCT Application No. PCT/JP2017/15306, filed on Apr. 14, 2017, which claims priority to Japan Patent Application No. P2016-083634 filed on Apr. 19, 2016 and is based upon and claims the benefit of priority from prior Japanese Patent Application No. P2016-083634 filed on Apr. 19, 2016 and PCT Application No. PCT/JP2017/15306, filed on Apr. 14, 2017, the entire contents of each of which are incorporated herein by reference.

FIELD

The embodiments described herein relate to a semiconductor device and a fabrication method of such a semiconductor device.

BACKGROUND

With increasing junction temperature Tj of power modules, power cycle capabilities have been insufficient under conventional technologies (aluminum (Al) wires). Recently, accordingly, in order to prolong lifetime, copper (Cu) wires may be used instead of the Al wires. Alternatively, upper wirings, e.g. lead materials or electrode pillars, may be used instead of the wires.

However, a power of ultrasonic waves becomes extremely larger than that of the Al wires when bonding the Cu wires onto semiconductor chips, and thereby devices will be broken.

On the other hand, when using the upper wirings, e.g. lead materials or electrode pillars, Pb-free solder has been used as bonding materials. However, in the case of such Pb-free solder is used, since a melting point becomes up to approximately the junction temperature Tj (=200° C.) in devices, e.g. silicon carbide (SiC), having a thermal resistance of 200° C. or more, and a ΔTj-power cycle also becomes large, the power cycle capability (power cycle lifetime) will be decreased.

SUMMARY

The embodiments provide a semiconductor device capable of improving a power cycle capability, and a fabrication method of such a semiconductor device.

According to one aspect of the embodiments, there is provided a semiconductor device comprising: a semiconductor chip on which electrodes are respectively formed on a front surface side and a back surface side of the semiconductor chip; and a high-thermal-resistant fired layer formed so as to cover at least a part of the electrode formed on the front surface side of the semiconductor chip.

According to another aspect of the embodiments, there is provided a semiconductor device comprising: an insulating substrate; first to third substrate electrodes formed on the substrate; a semiconductor chip disposed on the first substrate electrode, semiconductor chip on which electrodes are respectively formed on a front surface side and a back surface side of the semiconductor chip; a high-thermal-resistant fired layer formed so as to cover at least apart of the electrode formed on the front surface side of the semiconductor chip; a first upper wiring configured to connect between the fired layer and the second substrate electrodes; a second upper wiring configured to connect between the electrode which is not covered with the fired layer at the front surface side of the semiconductor chip, and the third substrate electrodes; and a resin formed to seal the first to third substrate electrodes, the semiconductor chip, and the first and second upper wirings.

According to still another aspect of the embodiments, there is provided a fabrication method of a semiconductor device comprising: forming a high-thermal-resistant conductive layer so as to cover an electrode formed on a semiconductor chip; and firing process of the high-thermal-resistant conductive layer.

According to the embodiments, there can be provided the semiconductor device capable of improving the power cycle capability, and the fabrication method of such a semiconductor device.

DESCRIPTION OF EMBODIMENTS

Next, the embodiments will be described with reference to drawings. In the description of the following drawings, the identical or similar reference sign is attached to the identical or similar part. However, it should be noted that the drawings are schematic and therefore the relation between thickness and the plane size and the ratio of the thickness differs from an actual thing. Therefore, detailed thickness and size should be determined in consideration of the following explanation. Of course, the part from which the relation and ratio of a mutual size differ also in mutually drawings is included.

Moreover, the embodiments shown hereinafter exemplify the apparatus and method for materializing the technical idea; and the embodiments do not specify the material, shape, structure, placement, etc. of each component part as the following. The embodiments may be changed without departing from the spirit or scope of claims.

Comparative Example 1

Figure 1:
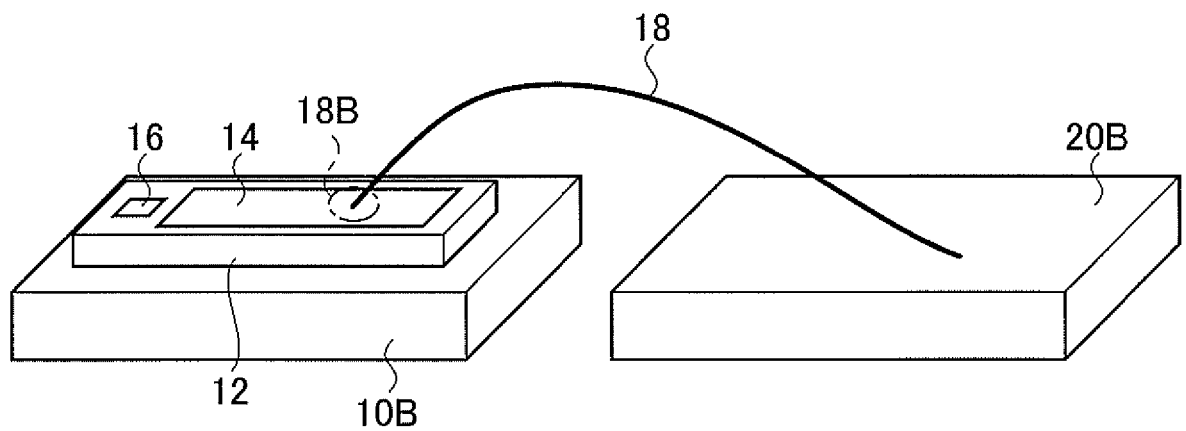
FIG. 1 is a schematic bird's-eye view showing a semiconductor device according to a comparative example 1.

As already explained, with increasing junction temperature Tj of power modules, power cycle capabilities have been insufficient under the Al wires. Accordingly, in a semiconductor device according to a comparative example 1, as shown in FIG. 1, a first substrate electrode 10B and a second substrate electrode 20B are connected to each other by means of a Cu wire 18. More specifically a semiconductor chip 12 is disposed on the first substrate electrode 10B, an ultrasonic wave is applied to a predetermined position 18B of a source pad electrode 14 on the semiconductor chip 12, and thereby the Cu wire 18 is bonded thereto. Reference sign 16 denotes a gate pad electrode.

According to the semiconductor device according to the comparative example 1, however, when bonding the Cu wire 18 thereto, since an extremely large power of the ultrasonic wave is required, the device will be broken. Alternatively, since it is necessary to make a structure of a pad in order to prevent such a break, the device structure becomes complicated.

First Embodiment (Semiconductor Device)

FIG. 2 is a schematic bird's-eye view of a semiconductor device according to a first embodiment.

Figure 2A:
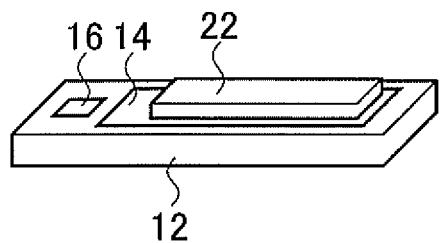
FIG. 2A is a diagram showing a state before bonding a Cu wire, in a schematic bird's-eye view showing a semiconductor device according to a first embodiment.

As shown in FIG. 2A, the semiconductor device according to the first embodiment includes: a semiconductor chip 12; and a high-thermal-resistant fired layer 22 formed so as to cover a source pad electrode 14 formed on the semiconductor chip 12.

For example, a silver (Ag) fired layer or copper (Cu) fired layer may be used as the high-thermal-resistant fired layer 22. Hereinafter, the Ag fired layer is called "Ag fired cap 22", and the Cu fired layer is called "Cu fired cap 22."

Figure 2B:
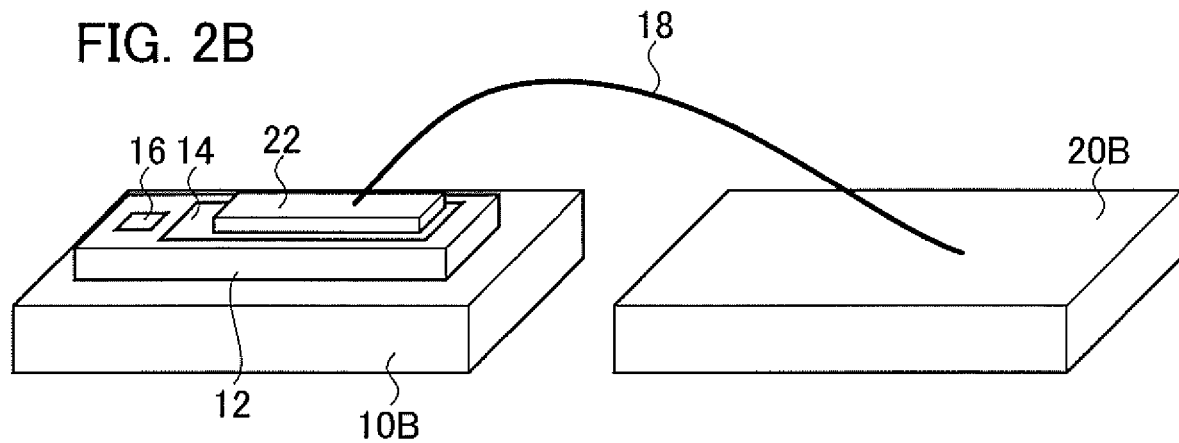
FIG. 2B is a diagram showing a state after bonding the Cu wire, in the schematic bird's-eye view showing the semiconductor device according to the first embodiment.

As shown in FIG. 2B, the semiconductor chip 12 is disposed on a first substrate electrode 10B, and one end of a copper wire 18 is bonded onto the Ag fired cap 22 by means of an ultrasonic wave. Moreover, another end of the copper wire 18 is bonded to a second substrate electrode 20B by means of the ultrasonic wave.

Alternatively, an Al wire or clad wire may be applied thereto instead of the copper wire 18. A center portion of the clad wire is formed by including Cu, and Al is bonded so as to cover the Cu at the center portion. The clad wire has a high thermal resistance and low thermal resistivity compared with the Al wire.

In this case, the first substrate electrode 10B and the second substrate electrode 20B can also be composed by a conduction pattern of a chip mounting surface side of an insulating substrates (circuit substrate), e.g. circuit substrates (e.g., a Direct Bonding Copper (DBC) substrate, a Direct Brazed Aluminum (DBA) substrate or an Active Metal Brazed (Active Metal Bond) (AMB) substrate) composed by including a contacted body of metal/ceramics/metal. As metallic materials of the front-surface-side electrode and back-surface-side electrode of the insulating substrate, the same material (s) is fundamentally used. For example, a $Cu/Al_2O_3/Cu$ structure etc. are applicable to the DBC substrate, an Al/AlN/Al structure etc. are applicable to the DBA substrate, and a $Cu/Si_3N_4/Cu$ structure etc. are applicable to the AMB substrate. However, a function of the front-surface-side electrode and a function of the back-surface-side electrode are slightly different from each other. The front-surface-side electrode has a function of bonding chips, electrodes, etc., a function as a positive (P) side power electrode, a negative (N) side power electrode and an output (Out) side power electrode respectively formed by cutting the pattern thereof, etc. The back-surface-side electrode has a function of conducting heat below by being bonded to a cooling apparatus or bonded to a heat spreader.

As mentioned above, the semiconductor device according to the first embodiment adopts the structure of capping the high-thermal-resistant firing material (Ag fired body or Cu fired body) on the source pad electrode 14 formed on the semiconductor chip 12. Thereby, since the power of the ultrasonic wave to be applied thereto when bonding the copper wire can be buffered, and a break of the device due to a large loading weight to be applied thereto when bonding the copper wire can be prevented, it becomes possible to improve the power cycle capability.

(Effect of Ag Fired Cap on Reduction of Damage to Device)

Figure 3:
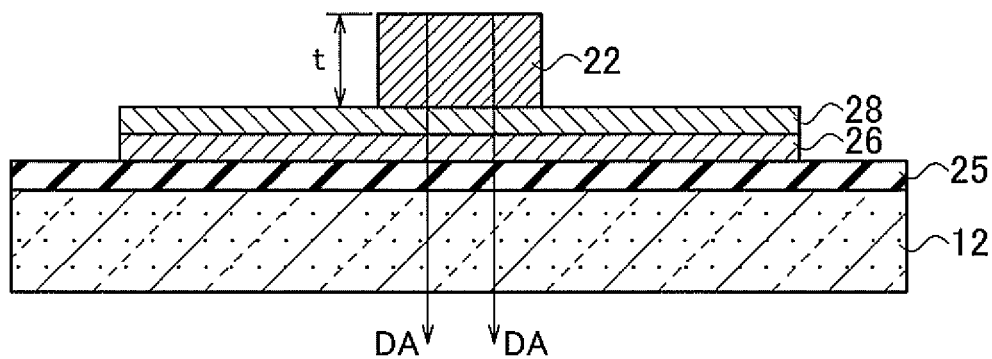
FIG. 3 is a schematic cross-sectional structure diagram showing a simulation model of the semiconductor device according to the first embodiment.

FIG. 3 is a schematic cross-sectional structure diagram showing a simulation model of the semiconductor device according to the first embodiment. In this case, as shown in FIG. 3, an oxide film 25 is formed on the silicon carbide (SiC) based semiconductor chip 12, an aluminum (Al) electrode 26 is formed on the oxide film 25, a gold (Au) thin film 28 is formed on the aluminum electrode 26 by means of a plating process, and an Ag fired cap 22 is formed on the Au thin film 28.

In this case, although the aluminum electrode 26 is illustrated, the materials of the electrode are not limited to aluminum and copper (Cu) may be used therefor.

Moreover, the Au, thin film 28 (thin film for coating electrode surface) is used in order that the Ag fired cap 22 adheres thereto. Instead of the Au thin film 28, an Ag thin film or palladium (Pd) thin film may be formed thereon.

Figure 4:
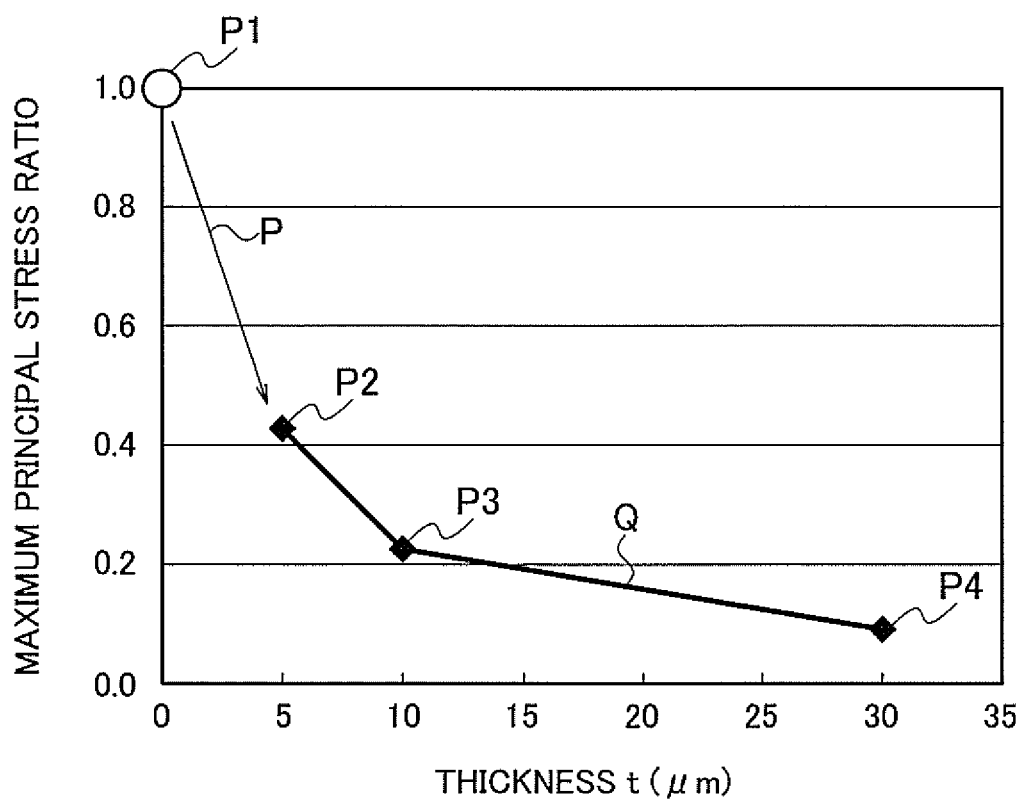
FIG. 4 is a graphic chart showing an effect of the simulation model shown in FIG. 3.

FIG. 4 shows a graphic chart showing an effect of the simulation model shown in FIG. 3. The horizontal axis indicates a layer thickness t of the Ag fired cap 22. The vertical axis indicates a maximum principal stress ratio to be applied to the oxide film 25 when applying a displacement DA to the Ag fired cap 22. In this case, the stress to be applied to the oxide film 25 when there is no Ag fired cap 22 is set to "1" (Refer to the point P1).

As proved by observing the arrow P shown in FIG. 4, the stress to be applied to the oxide film 25 can be dramatically reduced when there is the Ag fired cap 22. More specifically, when the layer thickness t of the Ag fired cap 22 is 5 μm, the maximum principal stress ratio is approximately 0.4 (Refer to the point P2). When the layer thickness t of the Ag fired cap 22 is 10 μm, the maximum principal stress ratio is approximately 0.2 (Refer to the point P3). When the layer thickness t of the Ag fired cap 22 is 30 μm, the maximum principal stress ratio is approximately 0.1 (Refer to the point P4). Although the layer thickness t of the Ag fired cap 22 is not limited in particular, it is preferable to be approximately 10 μm to approximately 100 μm, for example (Refer to the line Q).

As mentioned above, the semiconductor device according to the first embodiment is configured to cap with the Ag fired body the electrode formed on the device. Since this cap structure realize the function of the buffer material, the damage from the copper wire 18 can be reduced. Naturally, using the copper wire 18 achieves extremely strong bonding, and it can produce an effect of increasing the power cycle capability.

Comparative Example 2

Figure 5:
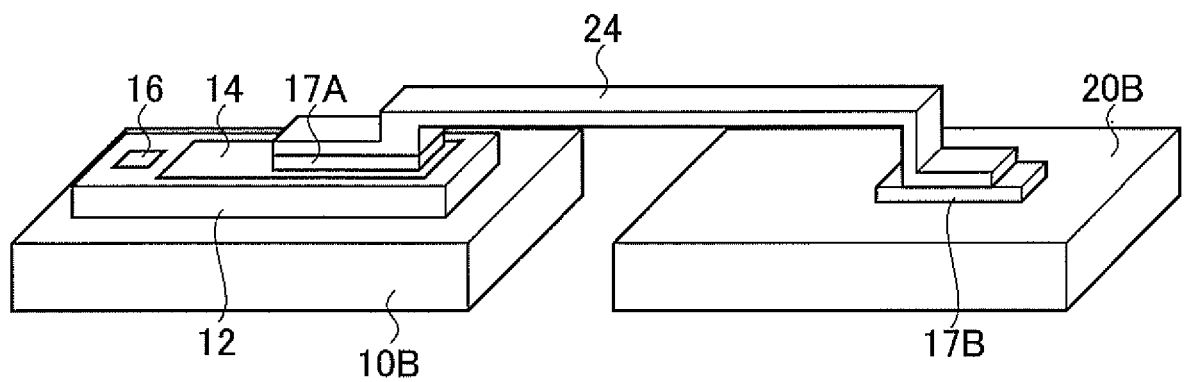
FIG. 5 is a schematic bird's-eye view showing a semiconductor device according to a comparative example 2.

As already explained, with increasing junction temperature Tj of power modules, power cycle capabilities have been insufficient under the aluminum wires. Accordingly, in a semiconductor device according to a comparative example 2, as shown in FIG. 5, the first substrate electrode 10B and the second substrate electrode 20B are connected using an upper wiring 24, e.g. a lead material or electrode pillar.

Thus, when using such an upper wiring, e.g. a lead material or electrode pillar, Pb-free solder 17A and 17B is used as bonding materials. The Pb-free solder 17A and 17B is Sn-based solder in which silver (Ag), copper (Cu), tin (Sn), etc. are blended as an additional component, including tin (Sn) as a principal component. However, in the case of such Pb-free solder 17A and 17B is used, since a melting point becomes up to approximately the junction temperature Tj (=200° C.) in devices, e.g. silicon carbide (SiC), having a thermal resistance of 200° C. or more, and a ΔTj-power cycle also becomes large, the power cycle capability will be decreased.

Second Embodiment (Semiconductor Device)

Figure 6:
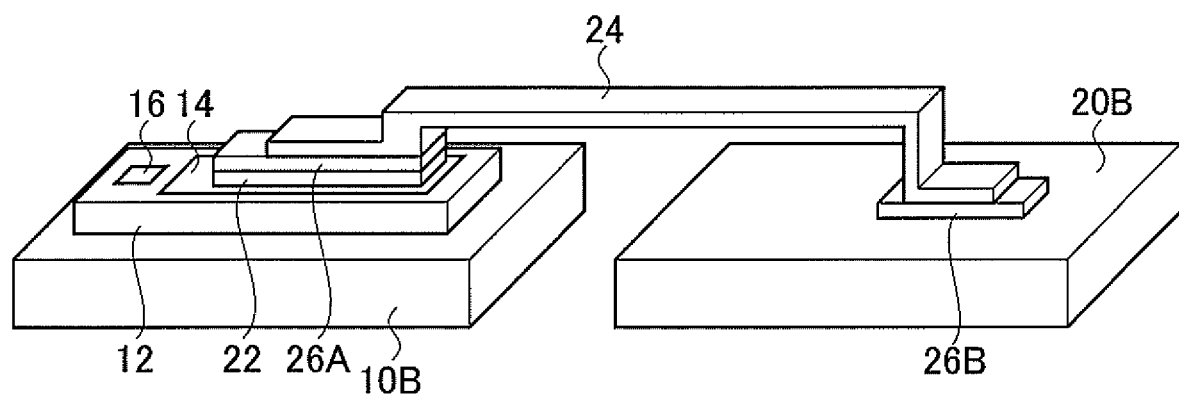
FIG. 6 is a schematic bird's-eye view showing a semiconductor device according to a second embodiment.

FIG. 6 is a schematic bird's-eye view of a semiconductor device according to a second embodiment.

As shown in FIG. 6, the semiconductor device according to the second embodiment includes: a semiconductor chip 12; and a high-thermal-resistant fired layer 22 formed so as to cover a source pad electrode 14 formed on the semiconductor chip 12, in the same manner as the first embodiment.

The high-thermal-resistant fired layer 22 is the Ag fired cap 22 (or Cu fired cap 22), in the same manner as the first embodiment. Although the layer thickness t of the Ag fired cap is not limited in particular, it is preferable to be approximately 10 μm to approximately 100 μm, for example.

The semiconductor chip 12 is disposed on a first substrate electrode 10B, and one end of a plate-like upper wiring 24 is bonded on the high-thermal-resistant fired layer 22 by means of solder 26A as a bonding material. Moreover, another end of the upper wiring 24 is bonded to a second substrate electrode 20B by means of solder 26B as a bonding material. Pb-free solder can be used for the solder 26A, 26B, in the same manner as the comparative example 2.

As mentioned above, the semiconductor device according to the second embodiment adopts the structure of capping the high-thermal-resistant firing material (Ag fired body or Cu fired body) on the source pad electrode 14 formed on the semiconductor chip 12 and of using the conventional solder thereon. Thereby the cumulative equivalent strain (distortion) to be applied to the solder can be reduced, and the power cycle capability can be improved.

(Comparison of Cumulative Equivalent Strain Between Presence and Absence of Ag Fired Cap)

Figure 7:
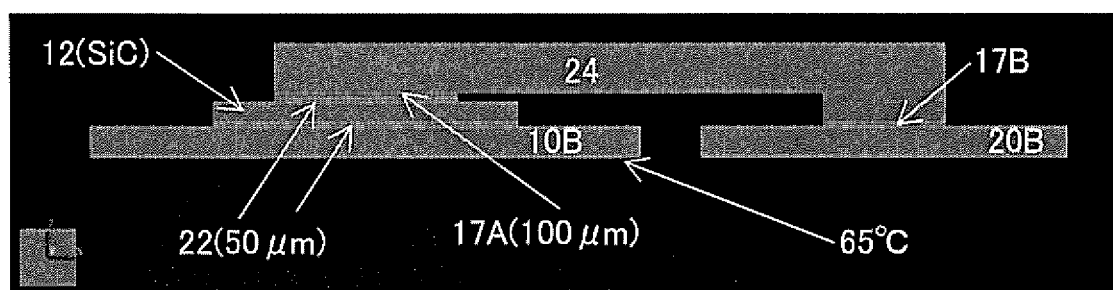
FIG. 7 is a schematic cross-sectional structure diagram showing a simulation model 1 (cap structure) of the semiconductor device according to the second embodiment.

FIG. 7 is a schematic cross-sectional structure diagram showing a simulation model 1 (cap structure) of the semiconductor device according to the second embodiment. As shown in FIG. 7, in the simulation model 1, the Pb-free solder 17A is formed on the Ag fired cap 22. The layer thickness of the solder 17A and 17B is assumed to be 100 μm, and the layer thickness of the Ag fired cap 22 is assumed to be 50 μm. A back side surface of the substrate electrode 10B is assumed to be cooled at 65° C.

Figure 8:
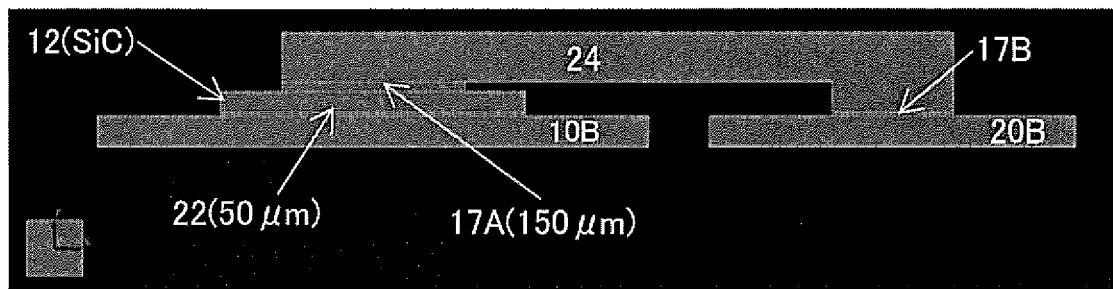
FIG. 8 is a schematic cross-sectional structure diagram showing a simulation model 2 (solder structure) of the semiconductor device according to the comparative example 2.

FIG. 8 is the schematic cross-sectional structure diagram showing a simulation model 2 (solder structure) of the semiconductor device according to the comparative example 2. As shown in FIG. 8, in the simulation model 2, only the Pb-free solder 17A and 17B is used. More specifically, the Ag fired cap 22 is not formed on the semiconductor chip 12, but is formed only under the semiconductor chip 12. The layer thickness of the solder 17A and 17B is assumed to be 150 μm.

Figure 9:
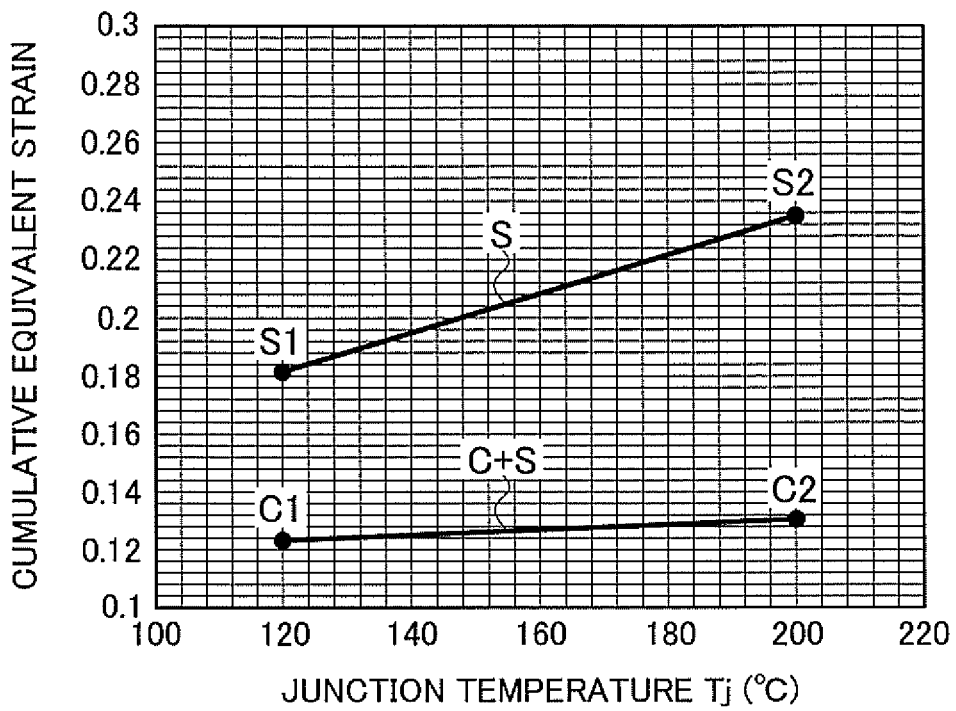
FIG. 9 is a graphic chart showing a comparison result between the simulation model 1 and the simulation model 2.

FIG. 9 is a graphic chart showing a comparison result between the simulation model 1 and the simulation model 2. The vertical axis indicates a cumulative equivalent strain to be applied to the solder, and the horizontal axis indicates a junction temperature Tj. The cumulative equivalent strain is used as a measure at the time of estimating a lifetime of materials, e.g. solder. In the same material, the lifetime becomes shorter as the cumulative equivalent strain becomes larger.

The line segment S which connects between the point S1 and the point S2 shows a change of a cumulative equivalent strain in the simulation model 2 (solder structure). As proved from the line segment S, the cumulative equivalent strain becomes larger as the junction temperature Tj is increased, in the solder structure.

On the other hand, the line segment C+S which connects between the point C1 and the point C2 shows a change of a cumulative equivalent strain in the simulation model 1 (cap structure). As proved from the line segment C+S, the cumulative equivalent strain is hardly changed due to the buffering effects of Ag fired cap 22, even if the junction temperature Tj is changed, in the cap structure.

More specifically, according to the cap structure, it is proved that the cumulative equivalent strain can be reduced by approximately 32% when the junction temperature Tj is 120° C., compared with the solder structure (Refer to the points C1 and S1). Moreover, it is proved that the cumulative equivalent strain can be reduced by approximately 44% when the junction temperature Tj is 200° C. (Refer to the points C2 and S2).

As mentioned above, according to the cap structure, there is the effect of improving the power cycle capability, or there is the effect of maintaining the power cycle capability even if the ΔTj-power cycle, MaxTj, becomes larger.

As expressed in the following equation, the ΔTj-power cycle corresponds to a difference between the maximum MaxTj of the junction temperature Tj when the power cycle is turned ON and the junction temperature MinTj when the power cycle is turned OFF. The ΔTj-power cycle becomes 100° C. when MaxTj is 150° C. and the MinTj is 50° C., and the ΔTj-power cycle becomes 150° C. when MaxTj is 200° C. and MinTj is 50° C.

$$\Delta Tj = \text{Max}Tj - \text{Min}Tj \quad \text{[Equation 1]}$$

Figure 10:
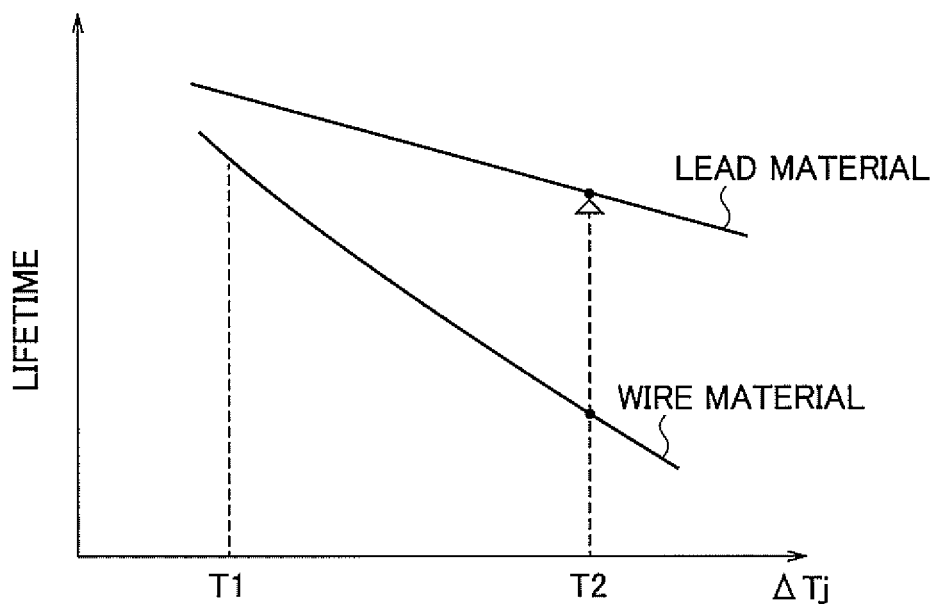
FIG. 10 shows a graphic chart showing a relationship between a ΔTj-power cycle and a power cycle lifetime.
Figure 11:
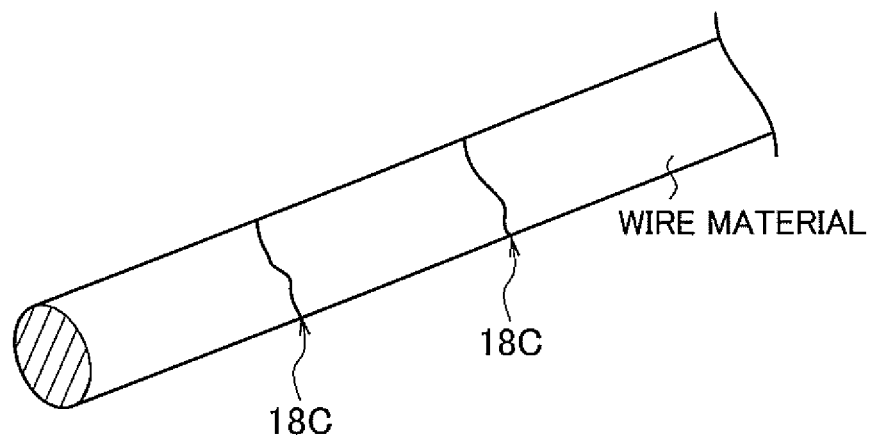
FIG. 11 is a diagram showing a state where a wire material is cracked.

A relationship between the ΔTj-power cycle and the power cycle lifetime is expressed, as schematically shown in FIG. 10. Normally, as shown in FIG. 10, the tendency for the lifetime to become longer is observed if the ΔTj-power cycle is lower (Refer to T1), and a tendency for the lifetime to become shorter is observed if the ΔTj-power cycle is higher (Refer to T2). Moreover, there is a tendency that: the wire material to be bonded at a bonding point is easily cracked (Refer to the cracks 18C shown in FIG. 11); but the wire material bonded at a bonding surface has a longer lifetime.

(Relationship Between Lifetime of Solder and Cumulative Equivalent Strain)

Subsequently, a calculating method of the fatigue life will now be explained. A case where a large load which creates an inelastic distortion (plastic strain, creep distortion) is repeatedly applied thereto and thereby the fatigue breakdown is caused by the small repetition number (equal to or less than $10^5$ cycles) is called a low cycle fatigue.

A fatigue life of the low cycle fatigue is expressed by the Manson-Coffin law shown as follows:

$$\Delta \varepsilon_p \cdot N_f^n = C \quad \text{[Equation 2]}$$

In Equation 2, $\Delta \varepsilon_p$ is an amplitude of plastic strain [−], $N_f$ is a plastic fatigue (fatigue life) [the number of times], and C and N are respectively material physical property values.

$$\Delta \varepsilon_{ne} = \frac{\varepsilon_{ac\_ne}(\text{fin\_step}) - \varepsilon_{ac\_ne}(\text{ref\_step})}{2} \quad \text{[Equation 3]}$$

Figure 12:
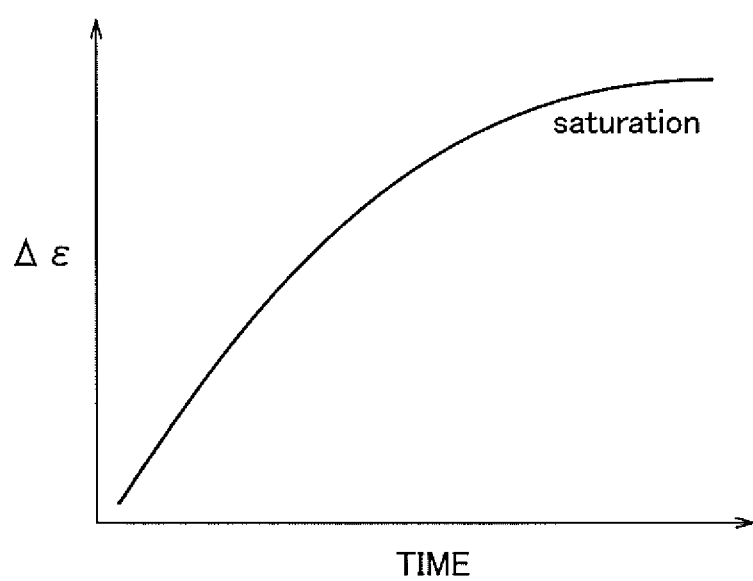
FIG. 12 shows a graphic chart showing a state where an amount of strains (distortions) is saturated with lapse of time.

In Equation 3, $\varepsilon_{ac\_ne}$ (fin_step) is the cumulative equivalent strain at a second cycle, and $\varepsilon_{ac\_ne}$ (ref_step) is the cumulative equivalent strain at a first cycle. Since an amount of the strains (distortions) is saturated with the lapse of time as shown in FIG. 12, an intermediate value between the first cycle and the second cycle is calculated in Equation 3. According to the Manson-Coffin law, the lifetime is prolonged as $\Delta\varepsilon_p$ becomes smaller. It is proved that the lifetime of the solder is prolonged since the cumulative equivalent strain becomes smaller according to the cap structure.

As mentioned above, the semiconductor device according to the second embodiment is configured to use the Pb-free solder 17A and 17B on the Ag fired cap 22. Accordingly, the stress which solder directly receives is buffered by the Ag fired cap 22, it becomes possible to reduce the cumulative equivalent strain to be applied to the solder, and to improve the power cycle capability.

[Fabrication Method]

Hereinafter, a fabrication method of the semiconductor device according to the first or second embodiment will now be explained.

Figure 13A:
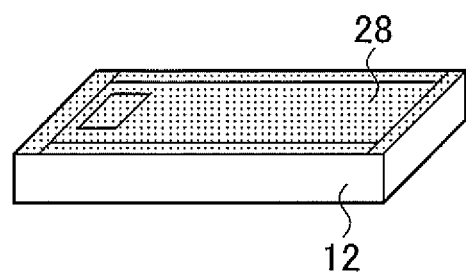
FIG. 13A is a diagram showing a semiconductor chip, in a diagram showing a fabrication method of the semiconductor device according to the first or second embodiment.
Figure 13B:
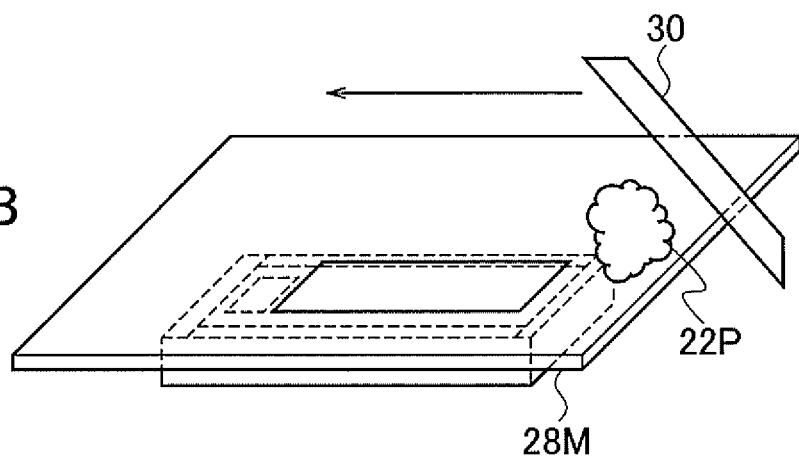
FIG. 13B is a diagram showing a mask printing process, in the diagram showing the fabrication method of the semiconductor device according to the first or second embodiment.
Figure 13C:
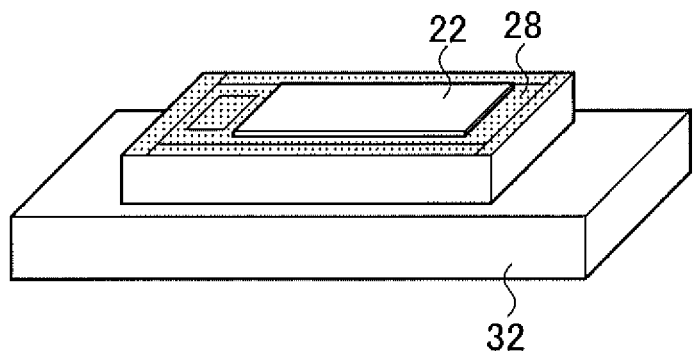
FIG. 13C is a diagram showing a drying process, in the diagram showing the fabrication method of the semiconductor device according to the first or second embodiment.
Figure 13D:
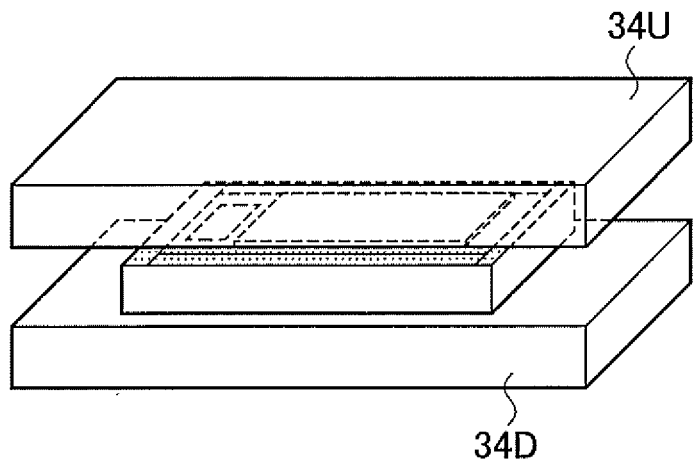
FIG. 13D is a diagram showing a firing process, in the diagram showing the fabrication method of the semiconductor device according to the first or second embodiment.
Figure 14:
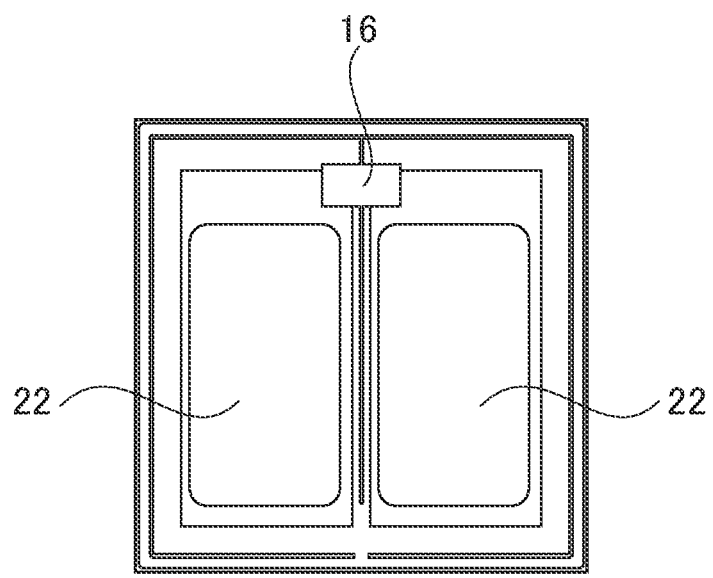
FIG. 14 is a photograph of a silver (Ag) fired cap fabricated by the fabrication method shown in FIG. 13.

Firstly, as shown in FIG. 13A, an Au thin film 28 is formed on an upper portion of the semiconductor chip 12. Subsequently, as shown in FIG. 13B, a firing paste 22P is pushed into an opening of a mask 28M using a squeegee 30, and mask printing is applied to an area corresponding to the source pad electrode 14. Subsequently, as shown in FIG. 13C, the semiconductor chip 12 on which the mask printing of the firing paste 22P (high-thermal-resistant conductive layer) is already performed is dried on a hot plate 32. Finally, as shown in FIG. 13D, the semiconductor chip 12 is annealed (heated and pressurized) by means of heating plates 34U and 34D. Thus, as shown in FIG. 14, the Ag fired cap 22 can be formed on the upper portion of the semiconductor chip 12.

Alternatively, a dispensing method may be applied to the above-mentioned process, instead of the mask printing. Even if using the dispensing method, the fired layer with quality of the same degree can be made.

[Modules]

Hereinafter, configurations of power modules including a plurality of the semiconductor devices according to the first or second embodiment will now be explained.

Figure 15A:
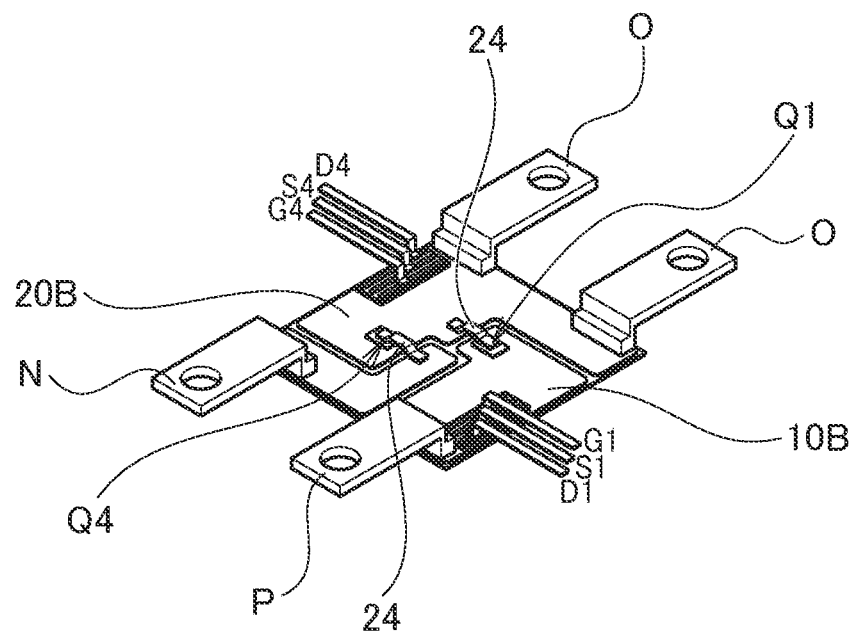
FIG. 15A is a bird's-eye view diagram, which is a configuration diagram (photograph) a module formed by using the semiconductor device according to the second embodiment.
Figure 15B:
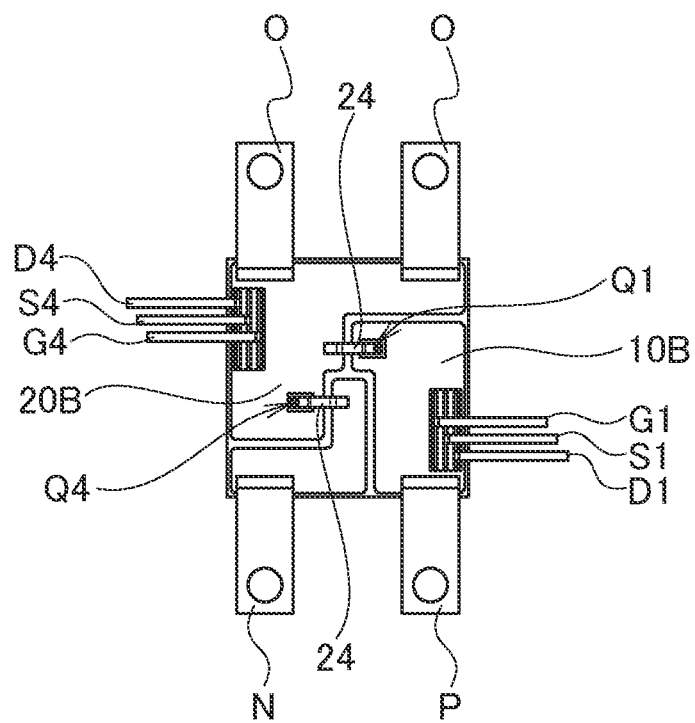
FIG. 15B is a top view diagram, which is a configuration diagram (photograph) a module formed by using the semiconductor device according to the second embodiment.
Figure 26A:
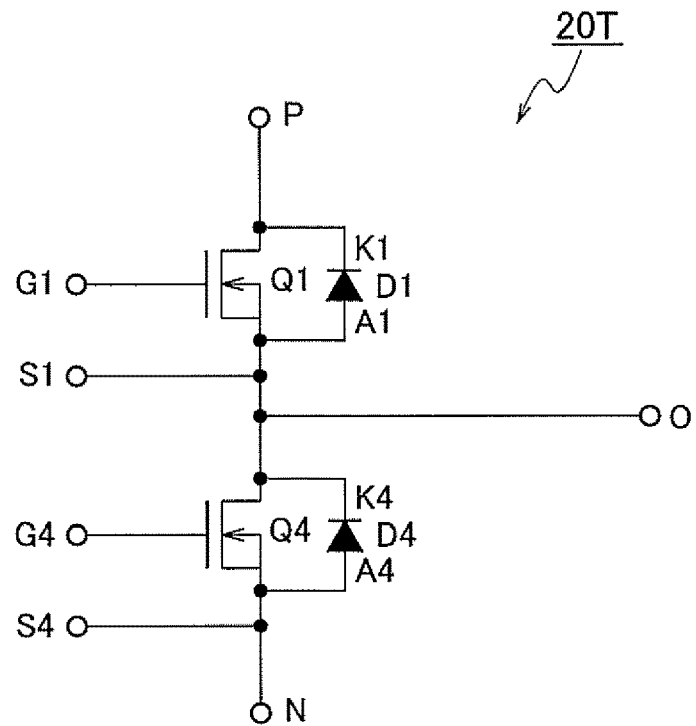
FIG. 26A is a schematic circuit representative diagram of the SiC MISFET of the 2-in-1 module, which is the semiconductor device according to the first or second embodiment.
Figure 26B:
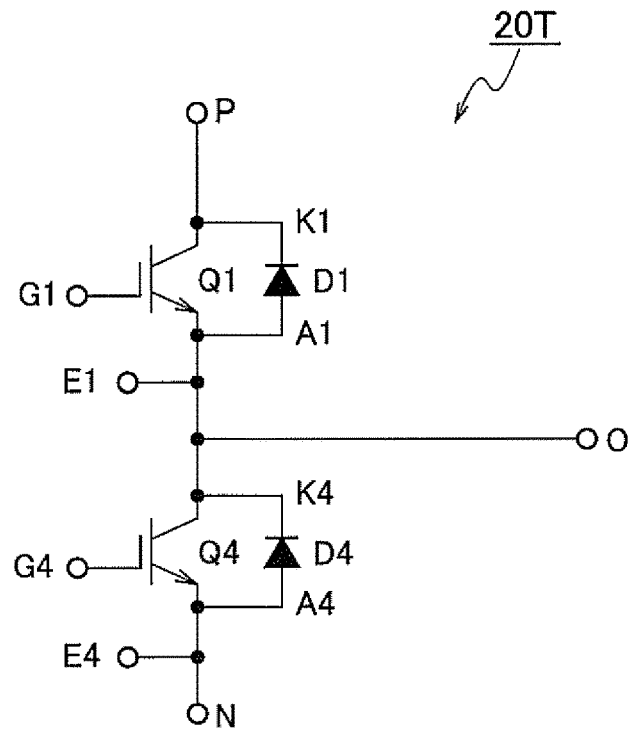
FIG. 26B is a schematic circuit representative diagram of the IGBT of the 2-in-1 module, which is the semiconductor device according to the first or second embodiment.

FIG. 15A is a bird's-eye view configuration diagram (photograph) of a module using the semiconductor device according to the second embodiment, and FIG. 15B is a top view diagram thereof. As shown in FIG. 15, the first substrate electrode 10B and the second substrate electrode 20B are connected to each other with the upper wiring 24. Signal electrode terminals G1, D1, and S1 and signal electrode terminals G4, D4, and S4 are respectively extracted to the outside from the first substrate electrode 10B and the second substrate electrode 20B. Naturally, it is also possible to connect the substrate electrodes other than the first substrate electrode 10B and second substrate electrode 20B, with the upper wiring 24. Moreover, a power terminal P corresponding to a drain D1 of an MISFET Q1 at a high level side is connected to the substrate electrode 10B, and a power terminal O (output terminal) corresponding to a drain D4 of an MISFET Q4 at a low level side or a source S1 of the MISFET Q1 at the high level side is connected to the substrate electrode 20B. Furthermore, a power terminal N corresponding to a source S4 of the MISFET Q4 at the low level side is connected to a land electrode connected to the source pad electrode S1 of the MISFET Q1 at the low level side through the upper wiring 24. In the above explanation, the MISFET Q1 at the high level side and the MISFET Q4 at the low level side correspond to a semiconductor device which is configured to a circuit of a 2-in-1 module as shown in FIG. 26A, for example. Alternatively, it may correspond to IGBTs (Q1, Q4) of a 2-in-1 module as shown in FIG. 26B. The same applies hereafter.

Figure 16:
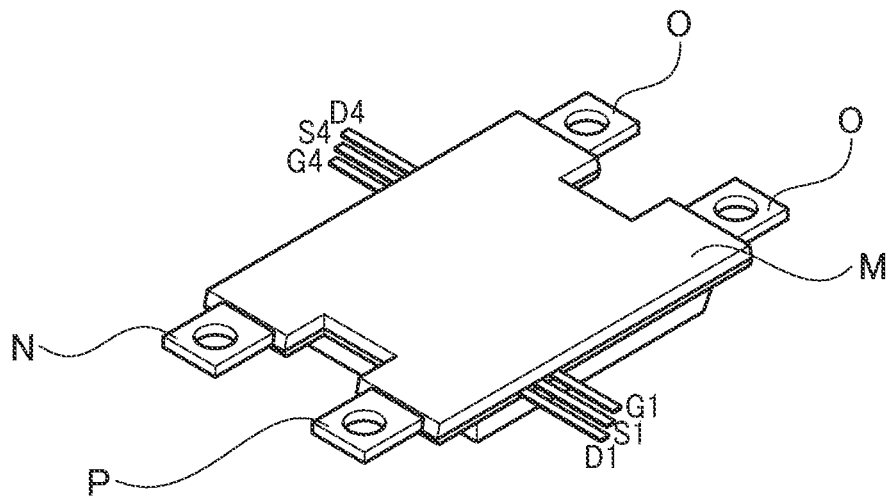
FIG. 16 is a configuration diagram (photograph) after molding the module shown in FIG. 15.

FIG. 16 is a configuration diagram (photograph) after molding the module shown in FIG. 15. As shown in FIG. 16, the first substrate electrode 10B and the second substrate electrode 20B are molded with a resin M etc.

Figure 17:
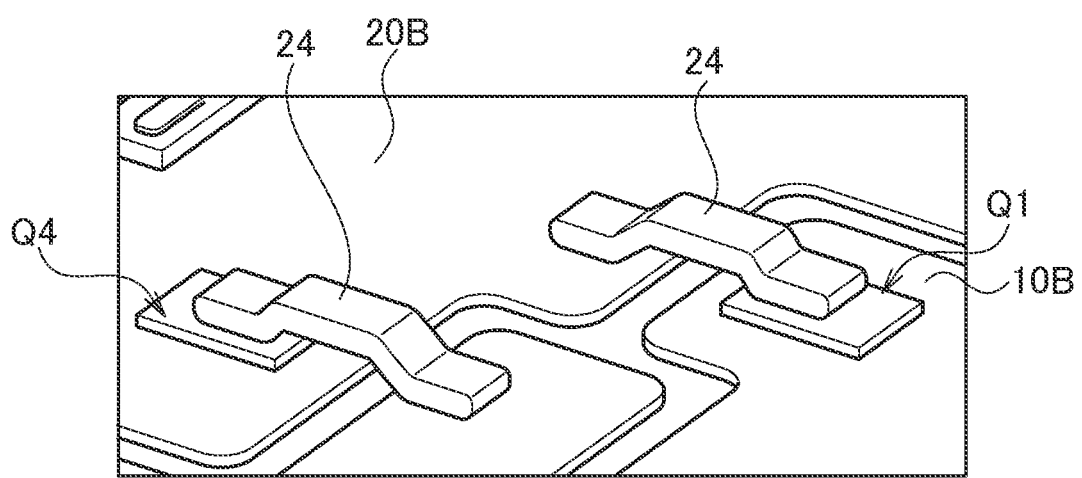
FIG. 17 shows a photograph to which the module shown in FIG. 15 is partially enlarged.
Figure 18:
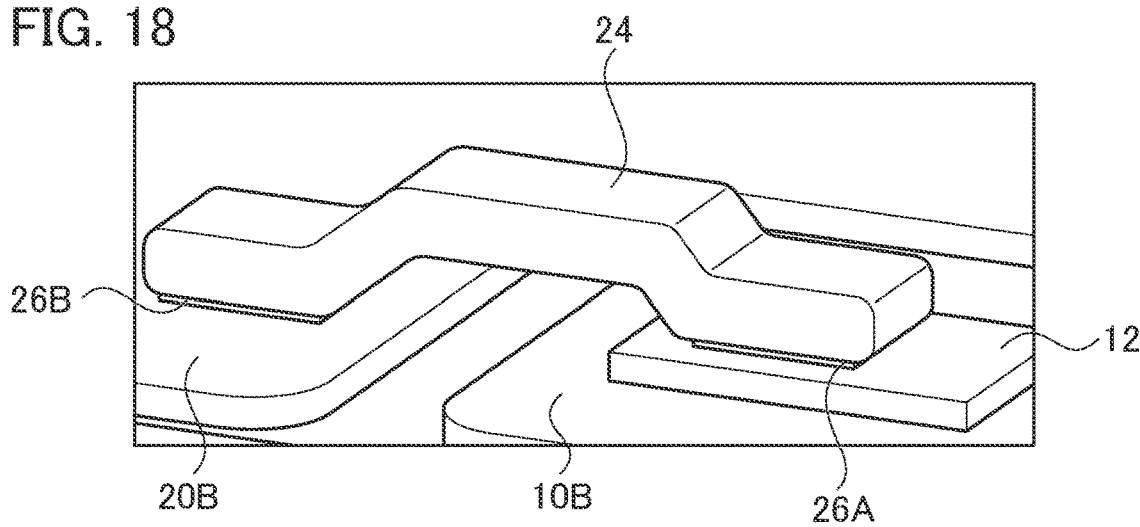
FIG. 18 shows a photograph to which the module shown in FIG. 15 is partially enlarged.

FIGS. 17 and 18 show photographs to which the module shown in FIG. 15 is partially enlarged. As shown in FIGS. 17 and 18, the semiconductor chip 12 is disposed on the first substrate electrode 10B. The Ag fired cap 22 is formed on the semiconductor chip 12, and the upper wiring 24 is bonded to the Ag fired cap 22 by means of the solder 26A and 26B.

Figure 19:
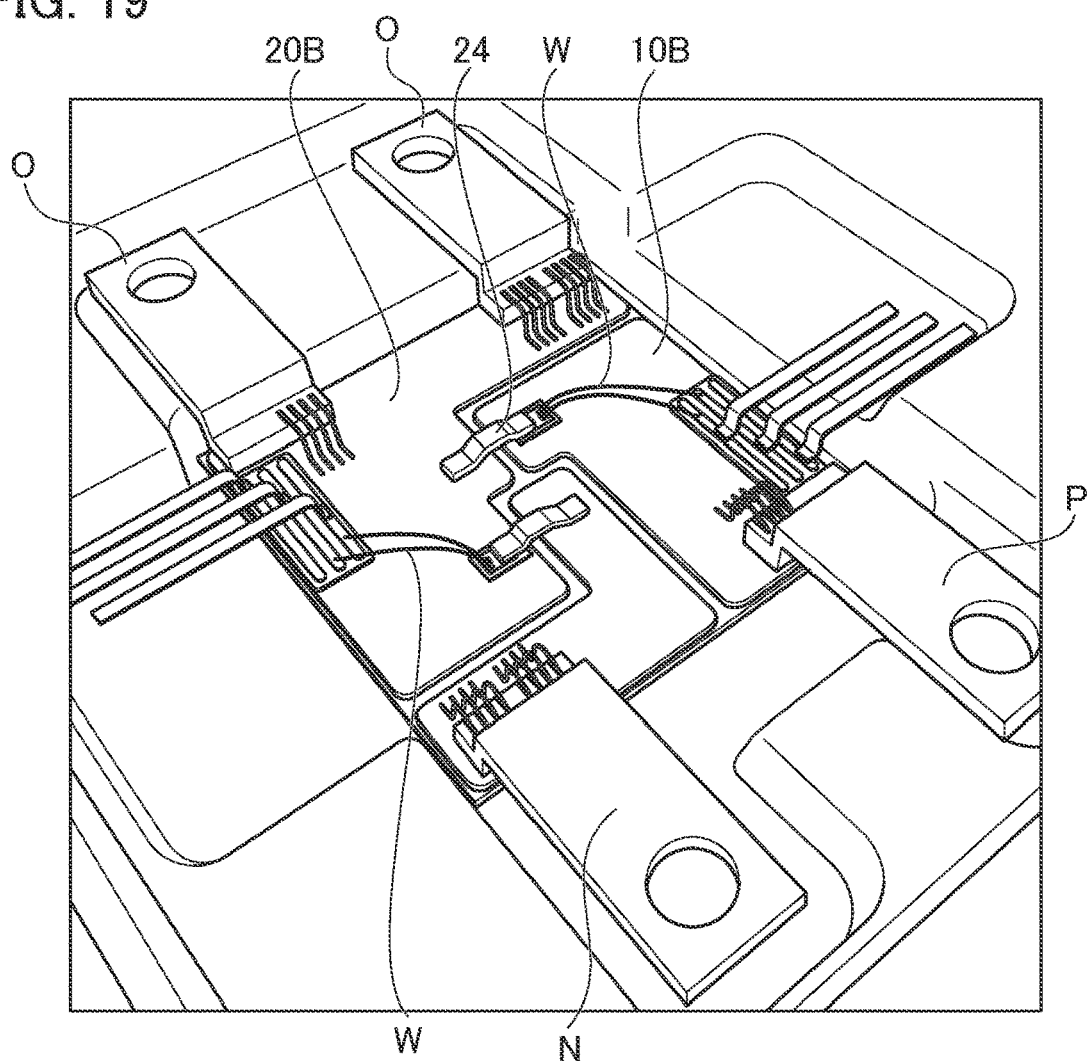
FIG. 19 shows a photograph showing the whole module shown in FIG. 15.
Figure 20:
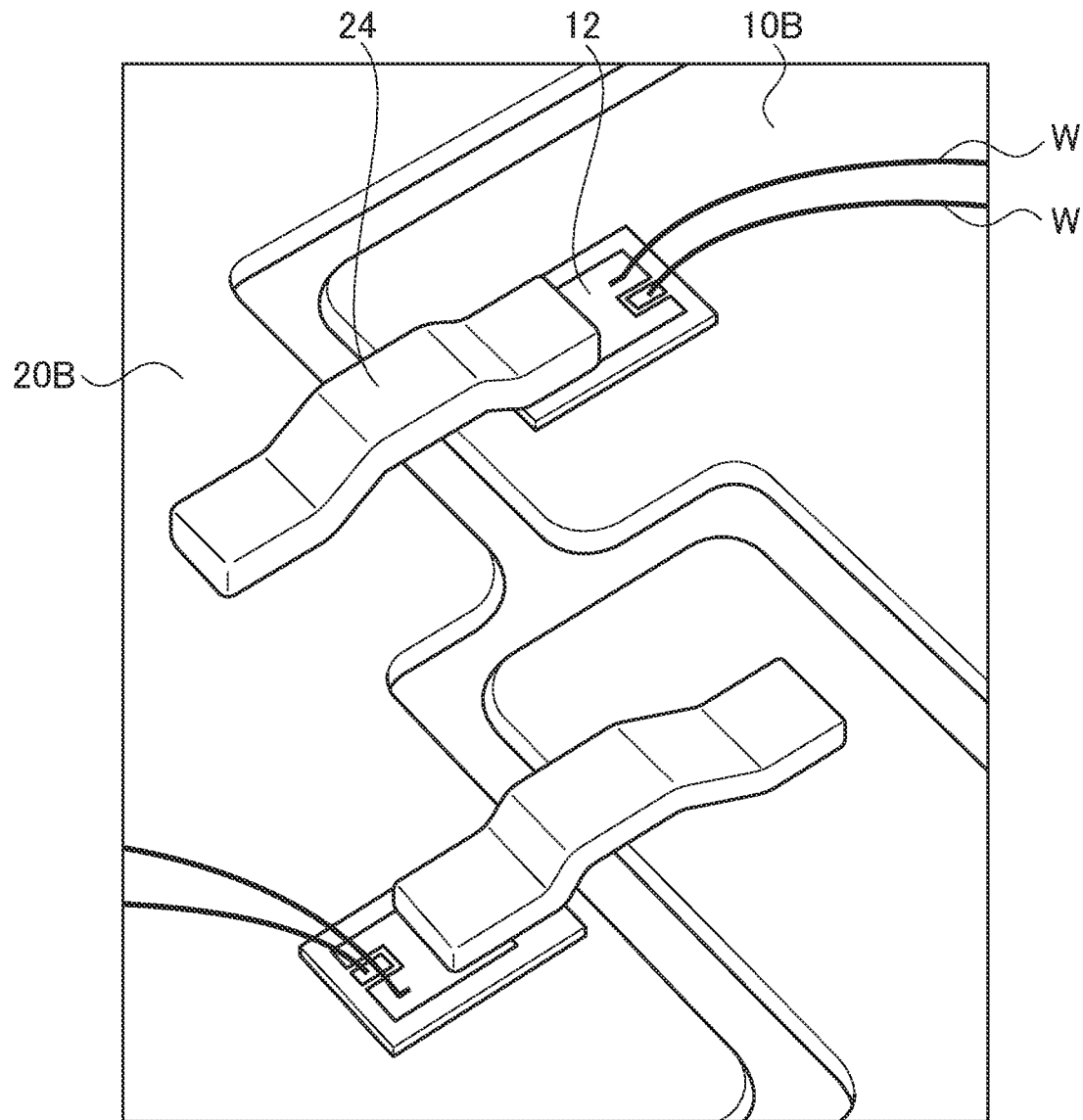
FIG. 20 shows a photograph to which the module shown in FIG. 15 is partially enlarged.

FIG. 19 shows a photograph showing the whole module shown in FIG. 15. FIG. 20 shows a photograph to which the module shown in FIG. 15 is partially enlarged. As shown in FIGS. 19 and 20, the semiconductor chip 12 is connected to the signal electrode terminals G1, D1, and S1 and the signal electrode terminals G4, D4, and S4 through wires W.

Figure 21:
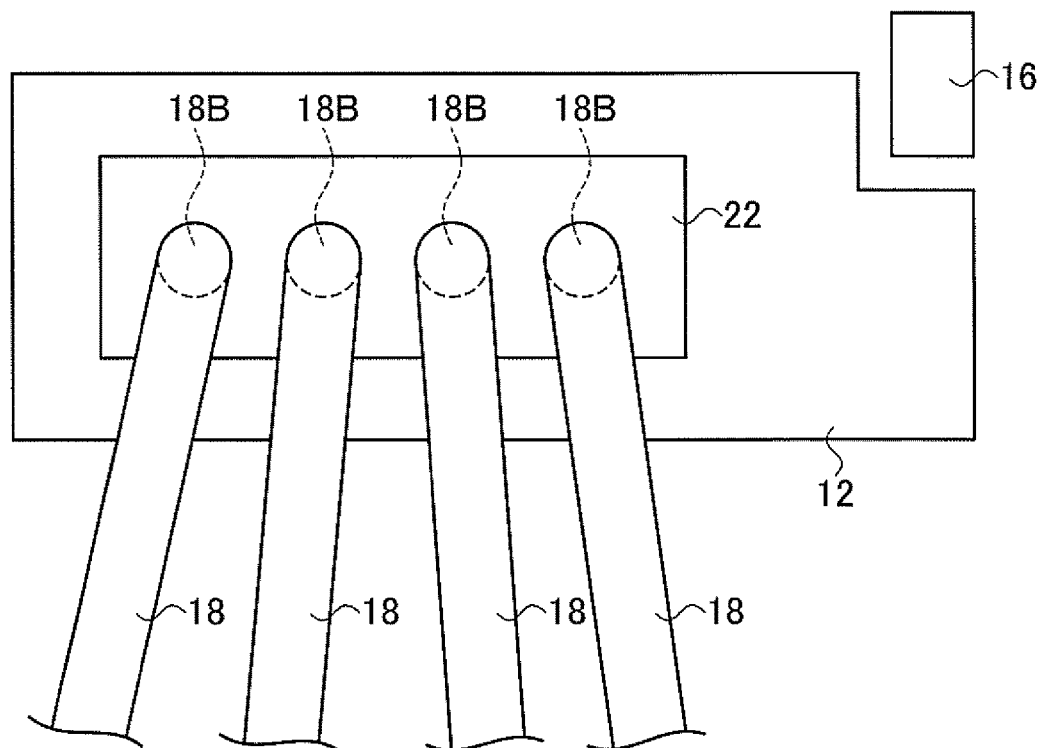
FIG. 21 is a schematic configuration diagram of a module formed by using the semiconductor device according to the first embodiment.

FIG. 21 is a schematic configuration diagram of a module formed by using the semiconductor device according to the first embodiment. As shown in FIG. 21, it is also possible to bond a plurality of copper wires 18 to one semiconductor chip 12.

[Bonding Energy]

Subsequently, bonding energy at the time of ultrasonically bonding will now be explained.

The bonding energy is calculated by integrating a coefficient of friction p, a velocity v, and a pressure P at the time of bonding, with a time period, as shown in the following equation. The coefficient of friction µ and the velocity v are functions of the pressure P. Generally, the bonding strength also becomes higher as the bonding energy becomes higher.

$$\text{Bonding Energy} = \int \mu(P)v(P)P \, d\mu dv dP \qquad [\text{Equation 4}]$$

[ΔTj-Power Cycle Test]

Figure 22:
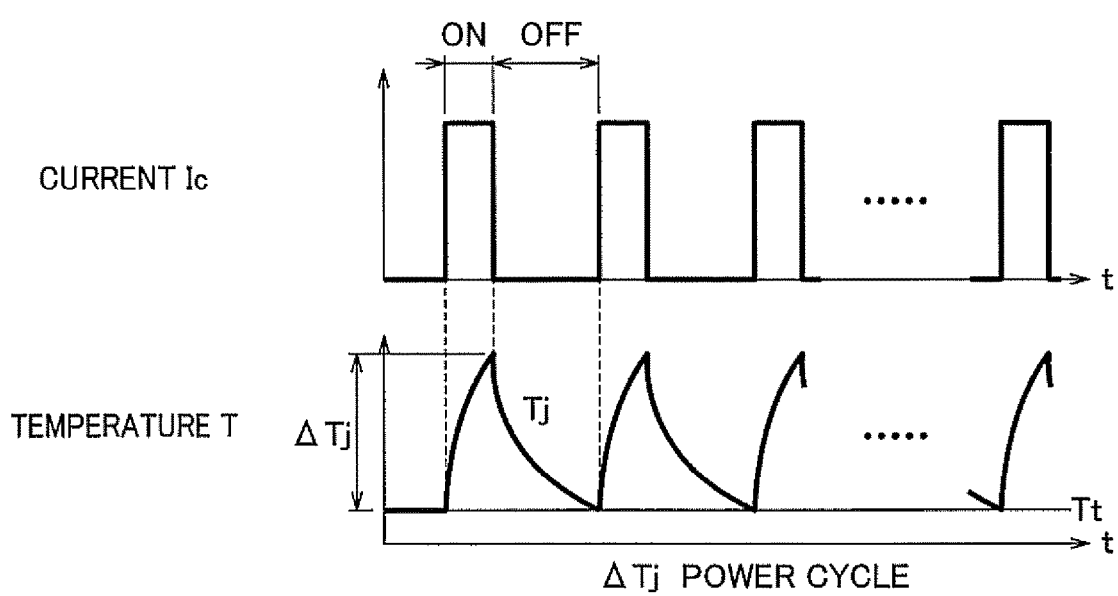
FIG. 22 is a schematic diagram of change of an electric current and a temperature, in a ΔTj-power cycle test of the semiconductor device according, to the first or second embodiment.

FIG. 22 shows a schematic diagram of a change of an electric current $I_C$ and a temperature T in a ΔTj-power cycle test of the semiconductor device according to the first or second embodiment.

As shown in FIG. 22, the ΔTj-power cycle test is a test to which a junction temperature is relatively risen and dropped at a short-time period, for example, and thereby a lifetime of a wire bonded portion etc. can be evaluated.

The power cycle test repeats electrical connection (ON) and disconnection (OFF) of the semiconductor device module so that the chip is heated, as shown in FIG. 22. The ΔTj-power cycle test of the semiconductor device according to the first or second embodiment repeats the electrical connection (ON) (the junction temperature Tj=150° C. for 2 seconds) and the electrical disconnection (OFF) (time period until it reaches cooling temperature (e.g., junction temperature Tj=50° C., and electrical disconnection (OFF) time=18 seconds)), for example.

[Thermal Cycle Test]

Figure 23:
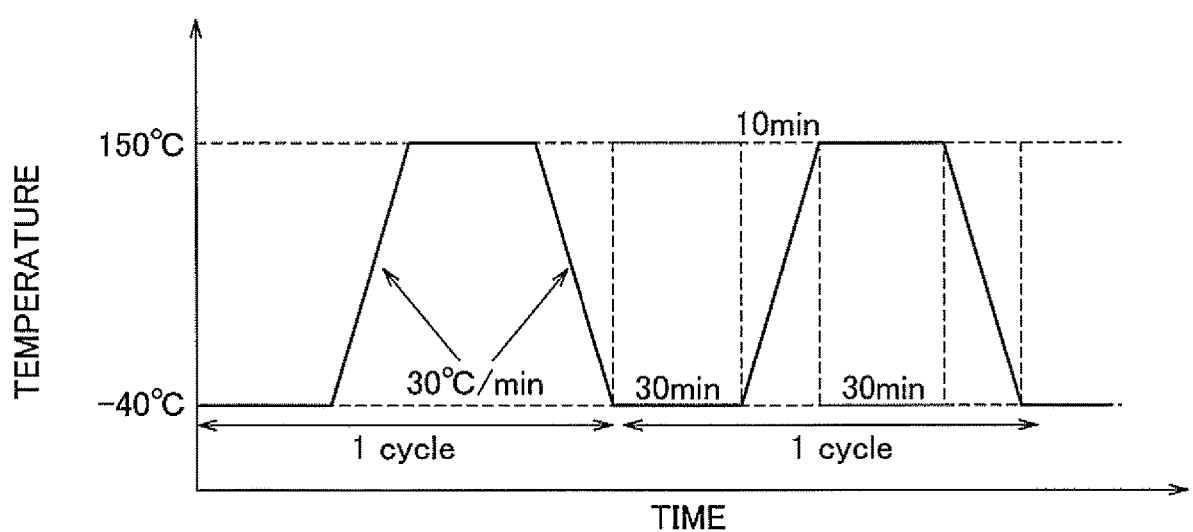
FIG. 23 shows an example of a temperature profile in a thermal cycle test of the semiconductor device according to the first or second embodiment.

FIG. 23 shows an example of a temperature profile in a thermal cycle test, in the semiconductor device according to the first or second embodiment. The thermal cycle test is conducted in the atmospheric air, and is implemented under a range from minus 40° C. to plus 150° C. The period of 1 cycle of the thermal cycle is 80 minutes, and the breakdown is as follows: 30 minutes at −40° C.; 10 minutes (heating time) from −40° C. to +150° C.; 30 minutes at +150° C.; and 10 minutes (cooling time) from +150° C. to −40° C. No characteristic degradation is observed, as a result of measuring forward voltage drop Vf and reverse breakdown voltage Vr for every 100 cycles.

Normally, also in the thermal cycle test or the power cycle test, if degradation of the bonded portion starts, a resistance is increased and the forward voltage Vf is also changed in the test of flowing a high forward electric current etc. Even if degradation including characteristic degradation occurs, it can be estimated that the power cycle capability is high if progress of the degradation is slow.

As a result of the above-mentioned ΔTj-power cycle test and the thermal cycle test, the bonding strength of the copper wire 18 or the upper wiring 24 of the semiconductor device according to the first or second embodiment is sufficiently secured.

Although the first or second embodiment is configured so that the copper wire 18 or the solder 26A is disposed on the Ag fired cap 22 in, it is not limited to this configuration. For example, it may be configured to bond the upper wiring 24 onto the Ag fired cap 22 by means of Ag firing. The layer thickness thereof can be increased by Ag-firing on the Ag fired cap 22. Thus, higher heat resistance can be effectively realized more than the case of using the solder 26A, and thereby the reliability can be improved.

[Concrete Examples of Semiconductor Device]

Figure 24A:
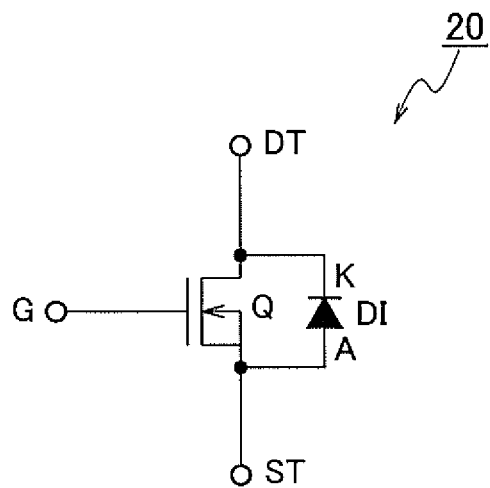
FIG. 24A is a schematic circuit representative diagram of the SiC MISFET of a 1-in-1 module, which is the semiconductor device according to the first or second embodiment.
Figure 24B:
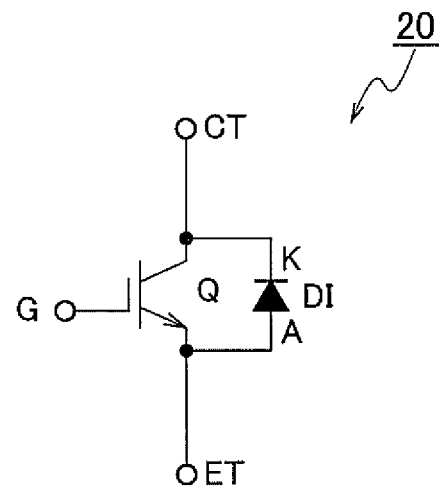
FIG. 24B is a schematic circuit representative diagram of an Insulated Gate Bipolar Transistor (IGBT) of the 1-in-1 module, in the semiconductor device according to the first or second embodiment.

FIG. 24A shows a schematic circuit representative of an SiC MISFET of the 1-in-1 module, which is the semiconductor device 20 according to the first or second embodiment. FIG. 24B shows a schematic circuit representation of the IGBT of the 1-in-1 module.

A diode DI connected in reversely parallel to the MISFET Q is shown in FIG. 24A. A main electrode of the MISFET Q is expressed with a drain terminal DT and a source terminal ST. Similarly, a diode DI connected in reversely parallel to the IGBT Q is shown in FIG. 24B. A main electrode of the IGBT Q is expressed with a collector terminal CT and an emitter terminal ET. As the diode DI, a fast recovery diode (FRD) or a Schottky barrier diode (SBD) may be externally installed. Only a diode formed in the semiconductor substrate of the MISFET may be used.

Figure 25:
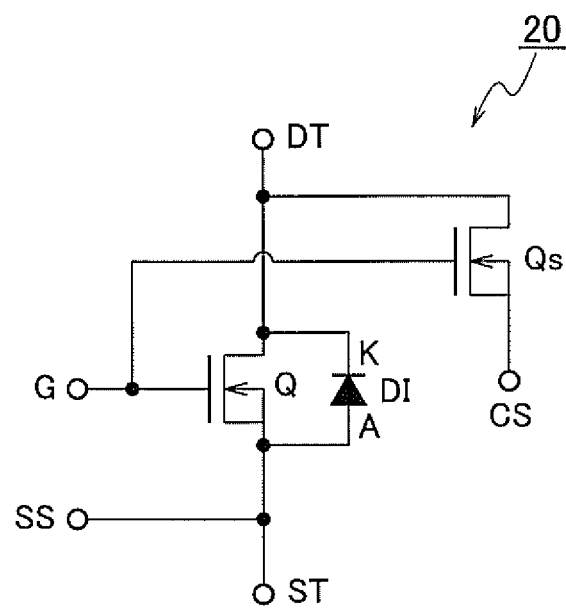
FIG. 25 is a detail circuit representative diagram of the SiC MISFET of the 1-in-1 module, which is the semiconductor device according to the first or second embodiment.

Moreover, FIG. 25 shows a detailed circuit representative of the SiC MISFET of the 1-in-1 module, which is the semiconductor device 20 according to the first or second embodiment.

Moreover, a plurality of the MISFET may be included in one module. As an example, five chips (MISFET×5) can be mounted thereon, and a maximum of five pieces of the MISFETs Q respectively can be connected to one another in parallel. Note that it is also possible to mount a part of five pieces of the chips for the diode DI thereon.

More particularly, as shown in FIG. 25, a sense MISFET Qs is connected to the MISFET Q in parallel. The sense MISFET Qs is formed as a miniaturized transistor in the same chip as the MISFET Q. In FIG. 25, reference sign SS denotes a source sense terminal, reference sign CS denotes a current sense terminal, and reference sign G denotes a gate signal terminal. Note that, also in the semiconductor chip Q according to the first or second embodiment, the sense MISFET Qs is formed as a minuteness transistor in the same chip.

Moreover, FIG. 26A shows a schematic circuit representative of the SiC MISFET of the 2-in-1 module, which is the semiconductor device 20T according to the first or second embodiment.

As shown in FIG. 26A, two MISFETs Q1, Q4, and diodes D1, D4 connected in reversely parallel to the MISFETs Q1, Q4 are built in one module. Reference sign G1 denotes a gate signal terminal of the MISFET Q1, and reference sign S1 denotes a source terminal of the MISFET Q1. Reference sign G4 denotes a gate signal terminal of the MISFET Q4, and reference sign S4 denotes a source terminal of the MISFET Q4. Reference sign P denotes a positive side power input terminal, reference sign N denotes a negative side power input terminal, and reference sign O denotes an output terminal.

Moreover, FIG. 26B shows a schematic circuit representative of the IGBT of the 2-in-1 module, which is the semiconductor device 20T according to the first or second embodiment. As shown in FIG. 26B, two IGBTs Q1, Q4, and diodes D1, D4 connected in reversely parallel to the IGBTs Q1, Q4 are built in one module. Reference sign G1 denotes a gate signal terminal of the IGBT Q1, and reference sign E1 denotes an emitter terminal of the IGBT Q1. Reference sign G4 denotes a gate signal terminal of the IGBT Q4, and reference sign E4 denotes an emitter terminal of the IGBT Q4. Reference sign P denotes a positive side power input terminal, reference sign N denotes a negative side power input terminal, and reference sign O denotes an output terminal.

(Configuration Examples of Semiconductor Chips)

Figure 27B:
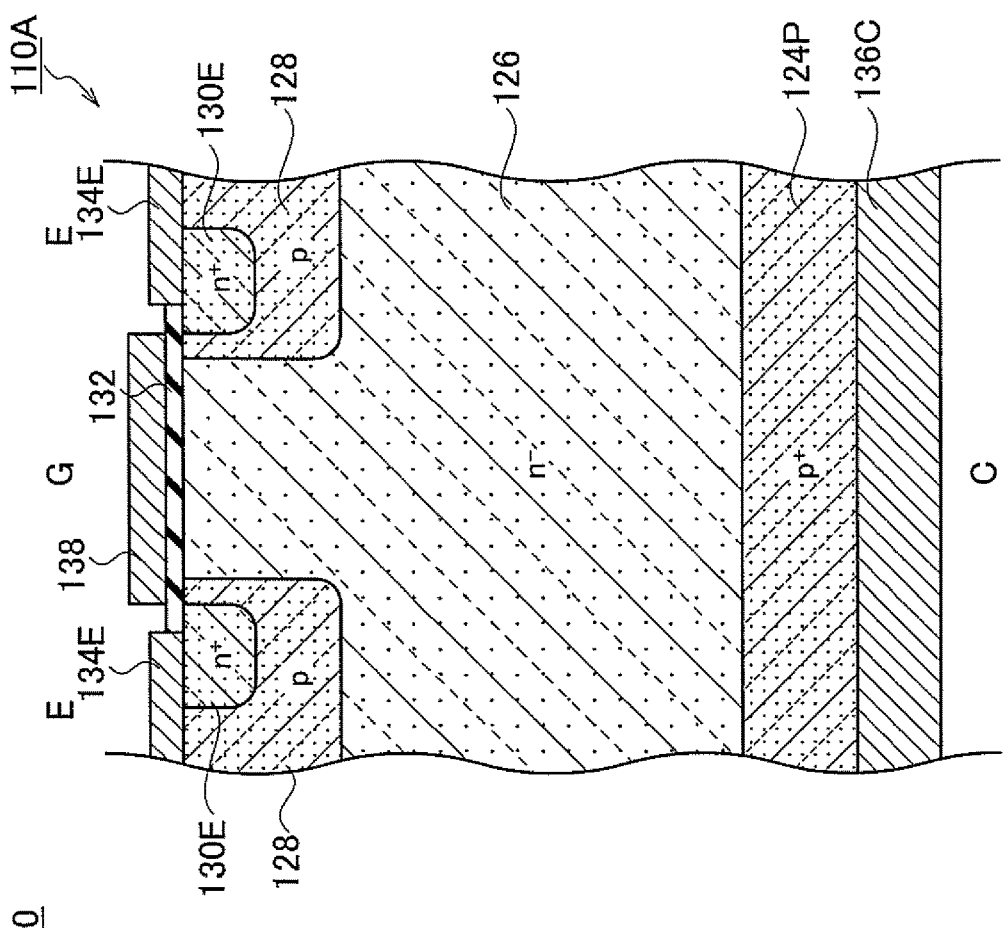
FIG. 27B is a schematic cross-sectional structure diagram of the IGBT, which is an example of a semiconductor chip to be applied to the semiconductor device according to the first or second embodiment.
Figure 27A:
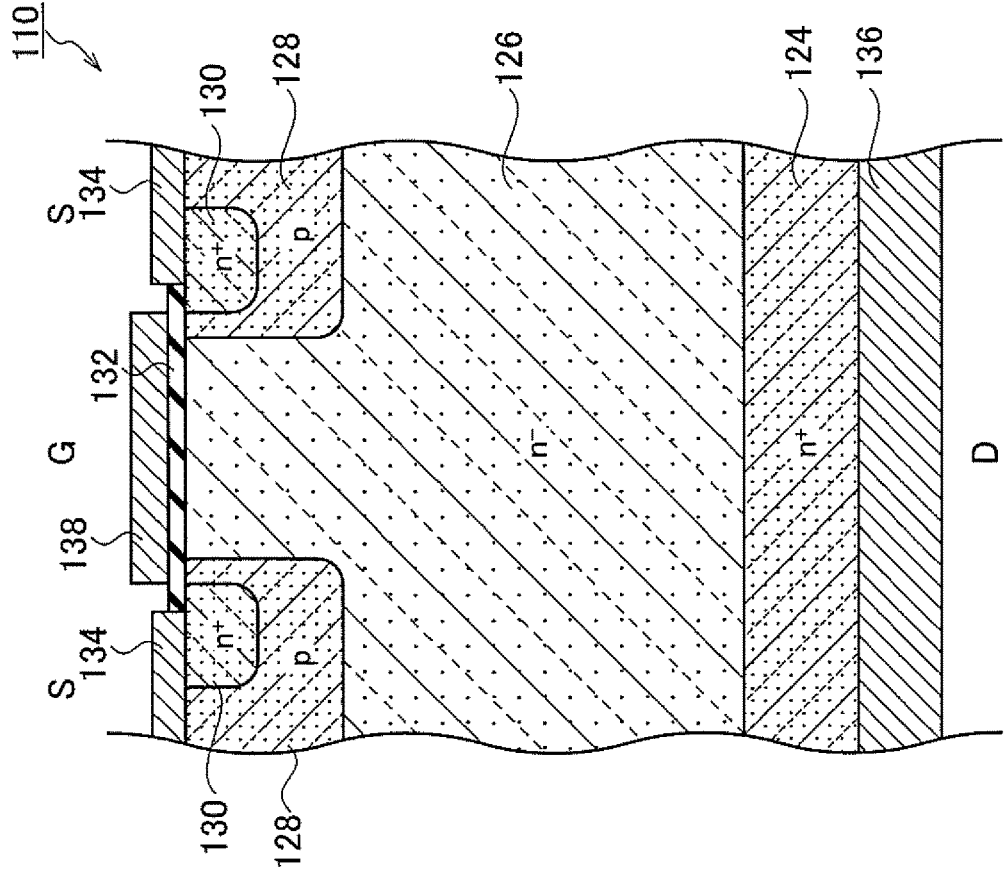
FIG. 27A is a schematic cross-sectional structure diagram of the SiC MISFET, which is an example of a semiconductor chip to be applied to the semiconductor device according to the first or second embodiment.

FIG. 27A shows a schematic cross-sectional structure of an SiC MISFET, which is an example of a semiconductor chip which can be applied to the first or second embodiment, and FIG. 27B shows a schematic cross-sectional structure of the IGBT.

As shown in FIG. 27A, a schematic cross-sectional structure of the SiC MISFET as an example of the semiconductor chip 110 (Q) which can be applied to the first or second embodiment includes: a semiconductor substrate 126 composed by including an n− type high resistivity layer; a p body region 128 formed on a front surface side of the semiconductor substrate 126; a source region 130 formed on a front side surface of the p body region 128; a gate insulating film 132 disposed on a front side surface of the semiconductor substrate 126 between the p body regions 128; a gate electrode 138 disposed on the gate insulating film 132; a source electrode 134 connected to the source region 130 and the p body region 128; an $n^+$ drain region 124 disposed on a back side surface opposite to the surface of the semiconductor substrate 126; and a drain electrode 136 connected to the $n^+$ type drain area 124.

Although the semiconductor chip 110 is composed by including a planar-gate-type n channel vertical SiC-MISFET in FIG. 27A, the semiconductor chip 110 may be composed by including an n channel vertical SiC-TMISFET, etc., shown in FIG. 31 mentioned below.

Moreover, a GaN based FET etc. instead of SiC MISFET can also be adopted to the semiconductor chip 110 (Q) which can be applied to the first or second embodiment.

Any one of an SiC based power device or a GaN based power device can be adopted to the semiconductor chip 110 applicable to the first or second embodiment.

Furthermore, a wide-bandgap type semiconductor of which the bandgap energy is from 1.1 eV to 8 eV, for example, can be used for the semiconductor chip 110 applicable to the first or second embodiment.

Similarly, as shown in FIG. 27B, the IGBT as an example of the semiconductor chip 110A (Q) applicable to the first or second embodiment includes: a semiconductor substrate 126 composed by including an n− type high resistivity layer; a p body region 128 formed on a front surface side of the semiconductor substrate 126; an emitter region 130E formed on a front side surface of the p body region 128; a gate insulating film 132 disposed on a front side surface of the semiconductor substrate 126 between the p body regions 128; a gate electrode 138 disposed on the gate insulating film 132; an emitter electrode 134E connected to the emitter region 130E and the p body region 128; a $p^+$ collector region 124P disposed on a back side surface opposite to the surface of the semiconductor substrate 126; and a collector electrode 136C connected to the p+ collector region 124P.

In FIG. 27B, although the semiconductor chip 110A is composed by including a planar-gate-type n channel vertical IGBT, the semiconductor chip 110A may be composed by including a trench-gate-type n channel vertical IGBT, etc.

Figure 28:
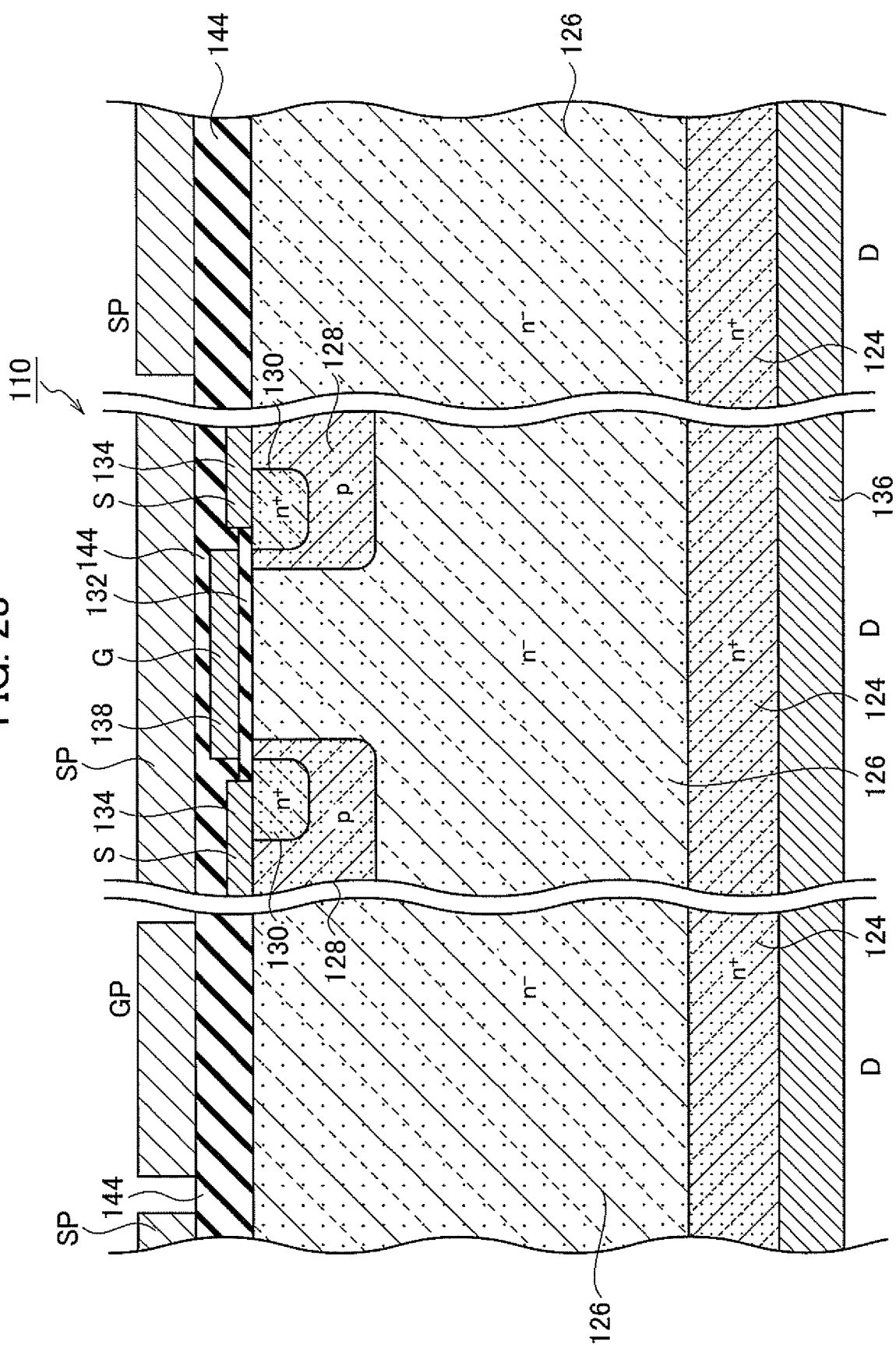
FIG. 28 is a schematic cross-sectional structure diagram showing an SiC MISFET including a source pad electrode SP and a gate pad electrode GP, which is an example of the semiconductor chip to be applied to the semiconductor device according to the first or second embodiment.

FIG. 28 shows a schematic cross-sectional structure of an SiC MISFET including a source pad electrode SP and a gate pad electrode GP, which is an example of the semiconductor chip 110 applicable to the first or second embodiment. The gate pad electrode GP is connected to the gate electrode 138 disposed on the gate insulating film 132, and the source pad electrode SP is connected to the source electrode 134 connected to the source region 130 and the p body region 128.

Moreover, as shown in FIG. 28, the gate pad electrode GP and the source pad electrode SP are disposed on an interlayer insulating film 144 for passivation which covers the surface of the semiconductor chip 110. Microstructural transistor structure may be formed in the semiconductor substrate 126 below the gate pad electrode GP and the source pad electrode SP in the same manner as the center portion shown in FIG. 27A or 28.

Furthermore, as shown in FIG. 28, the source pad electrode SP may be disposed to be extended onto the interlayer insulating film 144 for passivation, also in the transistor structure of the center portion.

Figure 29:
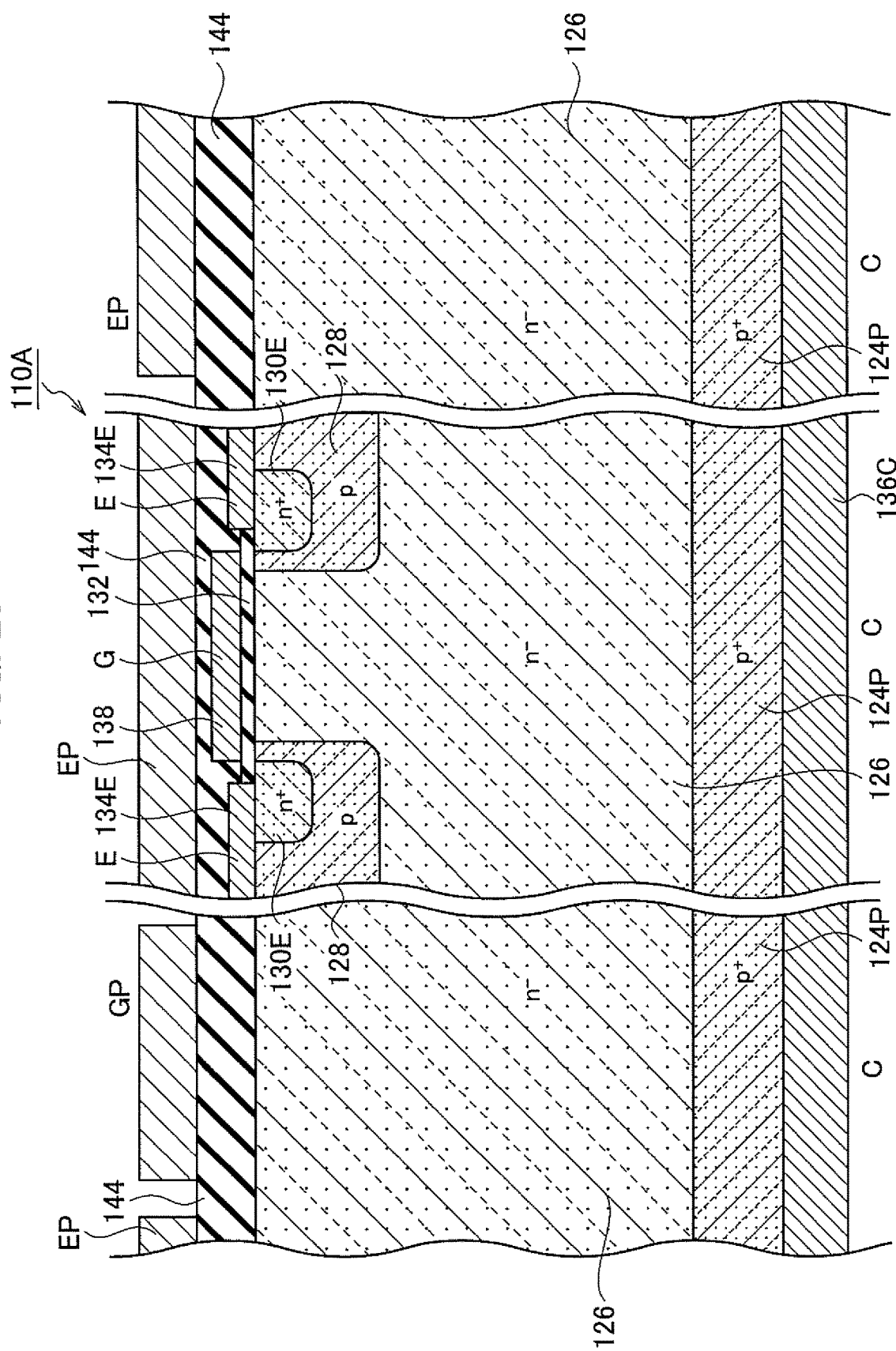
FIG. 29 is a schematic cross-sectional structure diagram of the IGBT including an emitter pad electrode EP and a gate pad electrode GP, which is an example of the semiconductor chip to be applied to the semiconductor device according to the first or second embodiment.

FIG. 29 shows a schematic cross-sectional structure of an IGBT including a source pad electrode SP and a gate pad electrode GP, which is an example of the semiconductor chip 110A to be applied to the first or second embodiment. The gate pad electrode GP is connected to the gate electrode 138 disposed on the gate insulating film 132, and the emitter pad electrode EP is connected to the emitter electrode 134E connected to the emitter region 130E and the p body region 128.

Moreover, as shown in FIG. 29, the gate pad electrode GP and the emitter pad electrode EP are disposed on an interlayer insulating film 144 for passivation which covers the surface of the semiconductor chip 110A. Microstructural IGBT structure may be formed in the semiconductor substrate 126 below the gate pad electrode GP and the emitter pad electrode EP in the same manner as the center portion shown in FIG. 27B or 29.

Furthermore, as shown in FIG. 29, the emitter pad electrode EP may be disposed to be extended onto the interlayer insulating film 144 for passivation, also in the IGBT structure of the center portion.

—SiC DIMISFET—

Figure 30:
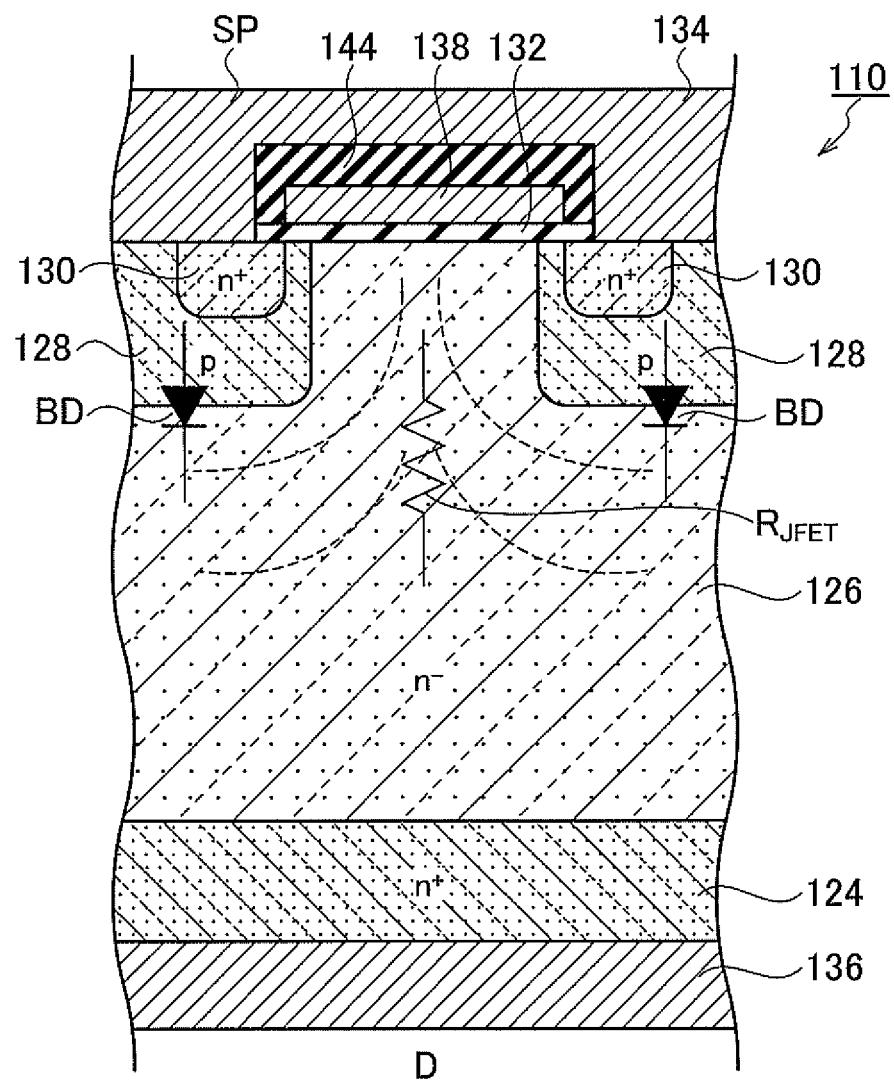
FIG. 30 is a schematic cross-sectional structure diagram of an SiC Double Implanted MISFET (SiC DIMISFET), which is an example of a semiconductor chip which can be applied to the semiconductor device according to the first or second embodiment.

FIG. 30 shows a schematic cross-sectional structure of an SiC DIMISFET, which is an example of a semiconductor chip 110 which can be applied to the first or second embodiment.

As shown in FIG. 30, the SiC DIMISFET applicable to the first or second embodiment includes: a semiconductor substrate 126 composed of an n− type high resistivity layer; a p body region 128 formed on a front surface side of the semiconductor substrate 126; an n+ source region 130 formed on a front side surface of the p body region 128; a gate insulating film 132 disposed on a front side surface of the semiconductor substrate 126 between the p body regions 128; agate electrode 138 disposed on the gate insulating film 132; a source electrode 134 connected to the source region 130 and the p body region 128; an n+ drain region 124 disposed on a back side surface opposite to the surface of the semiconductor substrate 126; and a drain electrode 136 connected to the n+ type drain area 124.

In the semiconductor chip 110 shown in FIG. 30, the p body region 128 and the n+ source region 130 formed on the front side surface of the p body region 128 are formed with double ion implantation (DI), and the source pad electrode SP is connected to the source region 130 and the source electrode 134 connected to the p body region 128. A gate pad electrode GP (not shown) is connected to the gate electrode 138 disposed on the gate insulating film 132. Moreover, as shown in FIG. 30, the source pad electrode SP and the gate pad electrode GP (not shown) are disposed on an interlayer insulating film 144 for passivation configured to cover the front side surface of the semiconductor chip 110.

As shown in FIG. 30, in the SiC DIMISFET, since a depletion layer as shown with the dashed lines is formed in the semiconductor substrate 126 composed of a n− type high resistivity layer inserted into the p body regions 128, channel resistance $R_{JFET}$ accompanying the junction type FET (JFET) effect is formed. Moreover, as shown in FIG. 30, body diodes BD are respectively formed between the p body regions 128 and the semiconductor substrates 126.

—SiC TMISFET—

Figure 31:
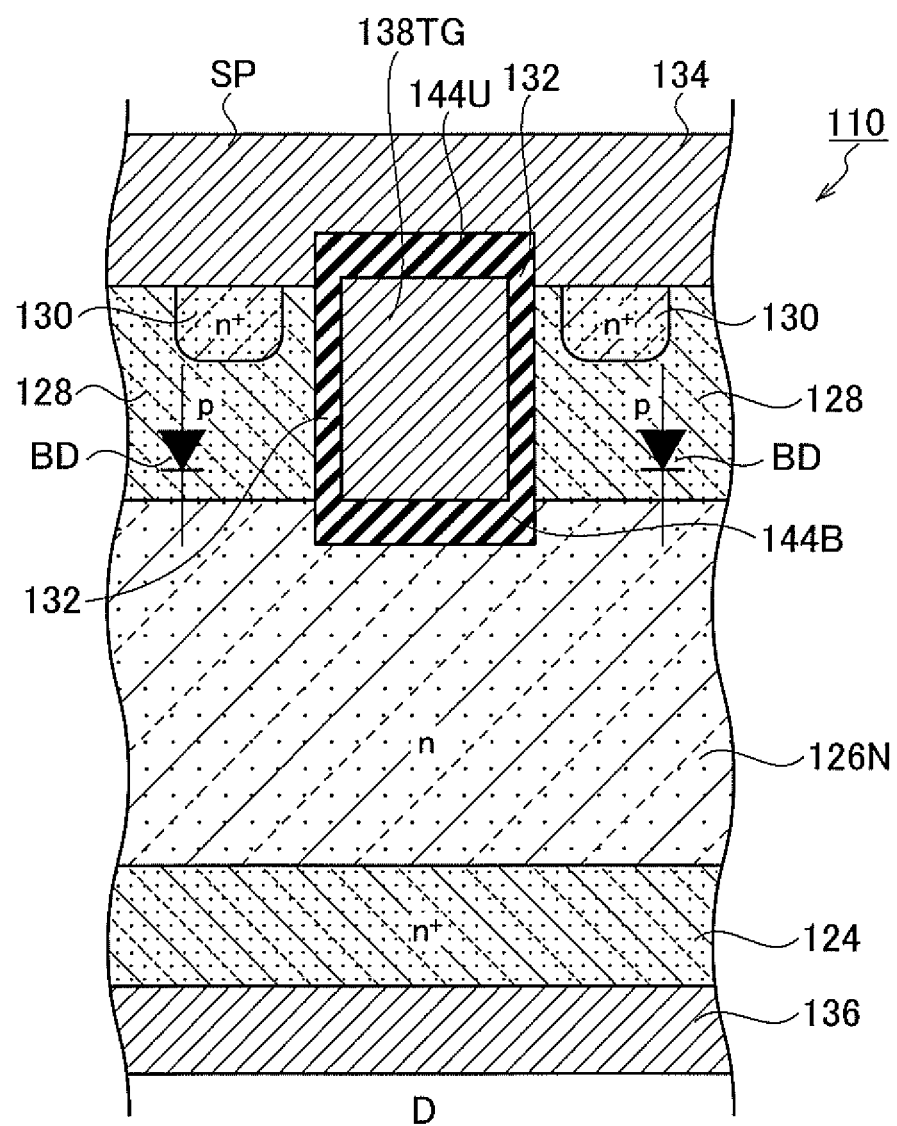
FIG. 31 is a schematic cross-sectional structure diagram of an SiC Trench MISFET (SiC TMISFET), which is an example of a semiconductor chip which can be applied to the semiconductor device according to the first or second embodiment.

FIG. 31 shows a schematic cross-sectional structure of an SiC TMISFET, which is an example of a semiconductor chip 110 which can be applied to the first or second embodiment.

As shown in FIG. 31, the SiC TMISFET applicable to the first or second embodiment includes: a semiconductor substrate 126N composed of an n− type high resistivity layer; a p body region 128 formed on a front surface side of the semiconductor substrate 126N; an n+ source region 130 formed on a front side surface of the p body region 128; a trench gate electrode 138TG passing through the p body region 128, the trench gate electrode 138TG formed in the trench formed up to the semiconductor substrate 126N via the gate insulating layer 132 and the interlayer insulating films 144U, 144B; a source electrode 134 connected to the source region 130 and the p body region 128; an n+ type drain area 124 disposed on a back side surface of the semiconductor substrate 126N opposite to the front side surface thereof; and a drain electrode 136 connected to the n+ type drain area 124.

In the semiconductor chip 110 shown in FIG. 31, a trench gate electrode 138TG passes through the p body region 128, and the trench gate electrode 138TG formed in the trench formed up to the semiconductor substrate 126N is formed via the gate insulating layer 132 and the interlayer insulating films 144U, 144B, and the source pad electrode SP is connected to the source region 130 and the source electrode 134 connected to the p body region 128. A gate pad electrode GP (not shown) is connected to the gate electrode 138 disposed on the gate insulating film 132. Moreover, as shown in FIG. 31, the source pad electrode SP and the gate pad electrode GP (not shown) are disposed on an interlayer insulating film 144U for passivation configured to cover the front side surface of the semiconductor chip 110.

In the SiC TMISFET, channel resistance $R_{JFET}$ accompanying the junction type FET (JFET) effect as the SiC DIMISFET is not formed. Moreover, body diodes BD are respectively formed between the p body regions 128 and the semiconductor substrates 126N.

Figure 32A:
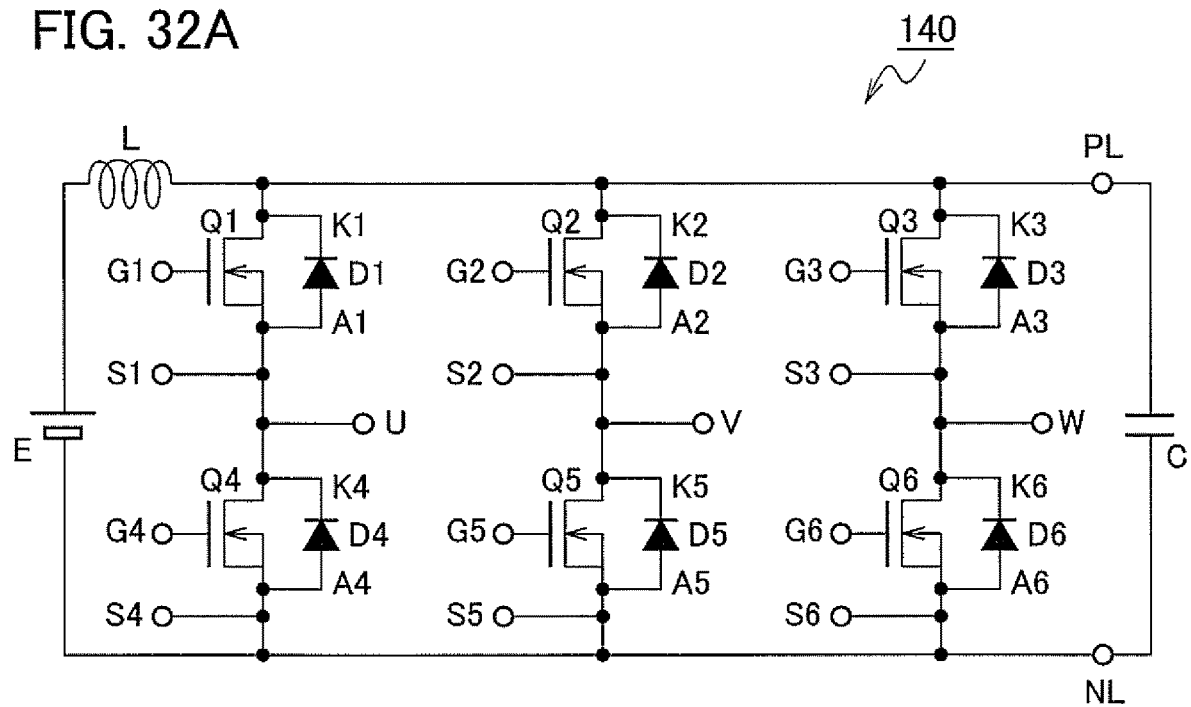
FIG. 32A shows an example of a circuit configuration in which the SiC MISFET is applied as a semiconductor chip, and a snubber capacitor is connected between a power terminal PL and an earth terminal (ground terminal) NL, in a schematic circuit configuration of a three-phase alternating current (AC) inverter composed using the semiconductor device according to the first or second embodiment.
Figure 32B:
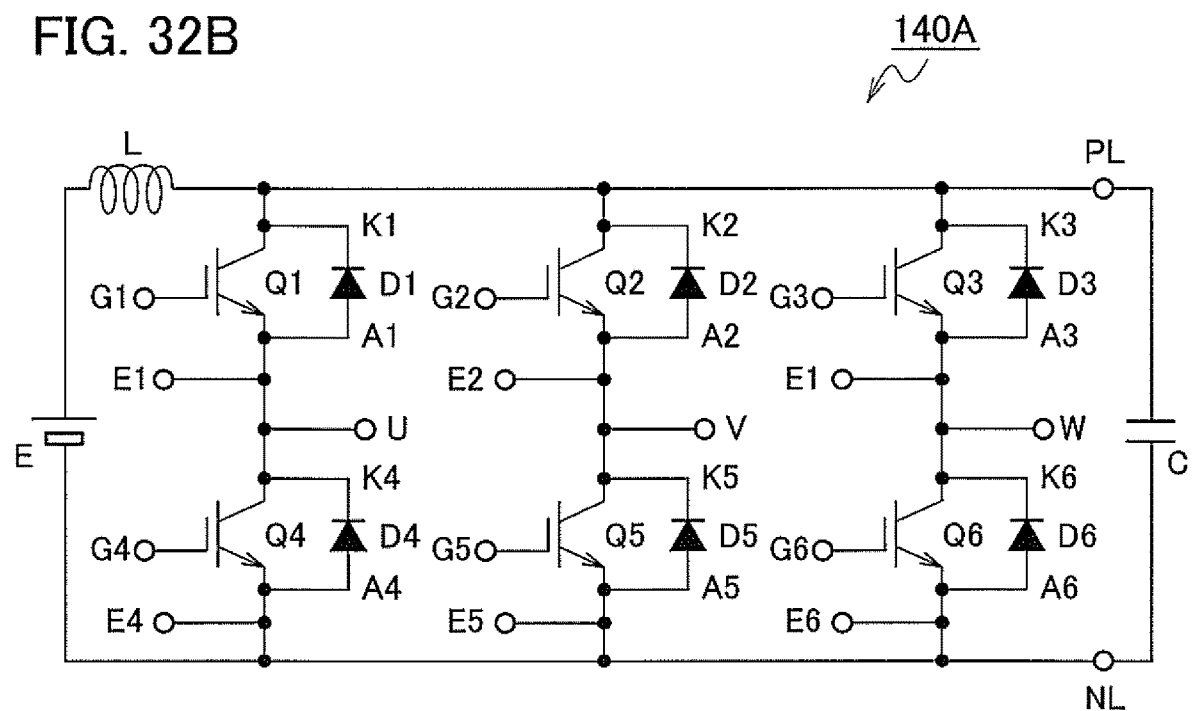
FIG. 32B shows an example of a circuit configuration in which the IGBT is applied as a semiconductor chip, and the snubber capacitor is connected between the power terminal PL and the earth terminal (ground terminal) NL, in the schematic circuit configuration of a three-phase AC inverter composed using the semiconductor device according to the first or second embodiment.

FIG. 32A shows an example of a circuit configuration in which the SiC MISFET is applied as a semiconductor chip, and a snubber capacitor C is connected between the power terminal PL and the earth terminal (ground terminal) NL, in a schematic circuit configuration of a three-phase AC inverter 140 composed using the semiconductor device according to the first or second embodiment. Similarly, FIG. 32B shows an example of a circuit configuration in which the IGBT is applied as a semiconductor chip, and a snubber capacitor C is connected between the power terminal PL and the earth terminal (ground terminal) NL, in a schematic circuit configuration of a three-phase AC inverter 140A composed using the semiconductor device according to the first or second embodiment.

When connecting the semiconductor device according to the first or second embodiment to the power source E, large surge voltage Ldi/dt is produced by an inductance L included in a connection line due to a high switching speed of the SiC MISFET and IGBT. For example, the surge voltage Ldi/dt is expressed as follows: $di/dt = 3 \times 10^9$ (A/s), where a current change di=300 A, and a time variation accompanying switching di/dt=100 ns. Although a value of the surge voltage Ldi/dt changes dependent on a value of the inductance L, the surge voltage Ldi/dt is superimposed on the power source V. Such a surge voltage Ldi/dt can be absorbed by the snubber capacitor C connected between the power terminal PL and the earth terminal (ground terminal) NL.

(Application Examples for Applying Semiconductor Device)

Next, there will now be explained the three-phase AC inverter 140 composed using the semiconductor device according to the first or second embodiment to which the SiC MISFET is applied as the semiconductor chip, with reference to FIG. 33.

Figure 33:
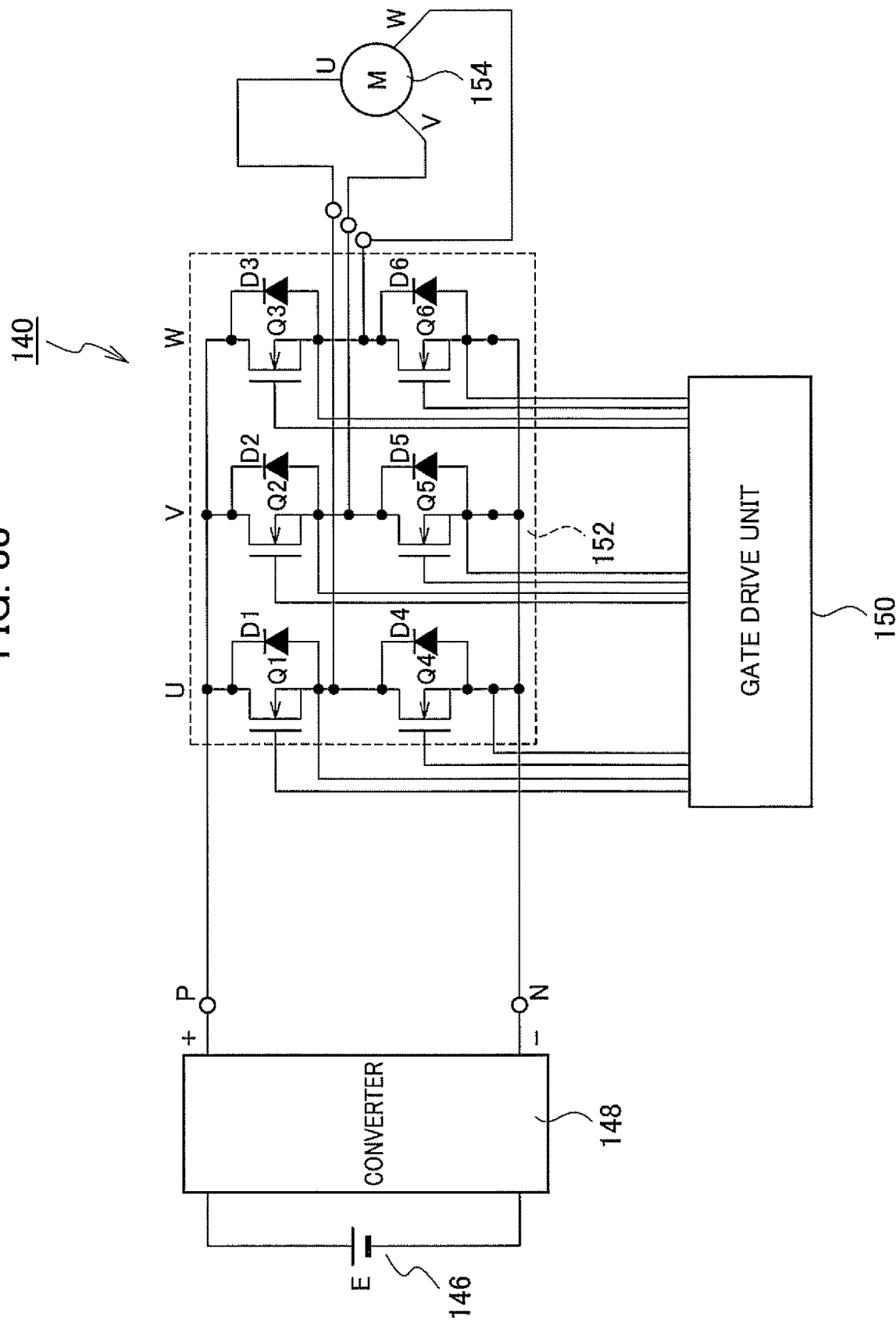
FIG. 33 is a schematic circuit configuration diagram of a three-phase AC inverter composed using the semiconductor device according to the first or second embodiment to which the SiC MISFET is applied as a semiconductor chip.

As shown in FIG. 33, the three-phase AC inverter 140 includes a gate drive unit 150, a semiconductor device unit 152 connected to the gate drive unit 150, and a three-phase AC motor unit 154. U-phase, V-phase, and W-phase inverters are respectively connected to the three-phase AC motor unit 154 so as to correspond to U phase, V-phase, and W-phase of the three-phase AC motor unit 154, in the semiconductor device unit 152. In the embodiments, the gate drive unit 150 is connected to the SiC MISFETs Q1, Q4, SiC MISFETs Q2, Q5, and the SiC MISFETs Q3, Q6.

The semiconductor device unit 152 includes the SiC MISFETs Q1, Q4, and Q2, Q5, and Q3, Q6 having inverter configurations connected between a positive terminal (+) and a negative terminal (−) of the converter 148 to which a storage battery (E) 146 is connected. Moreover, flywheel diodes D1-D6 are respectively connected reversely in parallel between the source and the drain of the SiC MISFETs Q1-Q6.

Next, there will now be explained the three-phase AC inverter 140A composed using the first or second semiconductor device 20T according to the embodiments to which the IGBT is applied as the semiconductor chip, with reference to FIG. 34.

Figure 34:
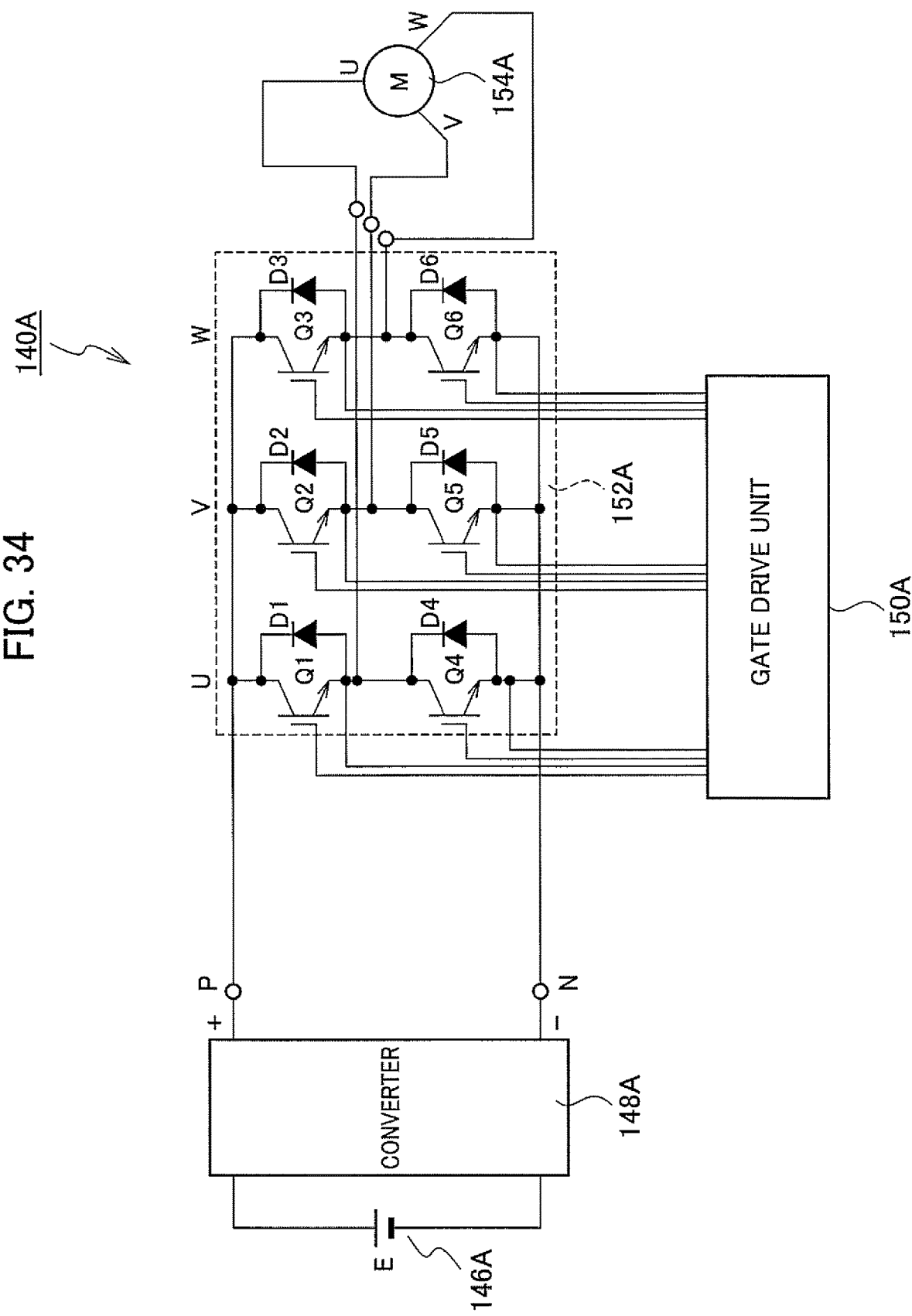
FIG. 34 is a schematic circuit configuration diagram of a three-phase AC inverter composed using the semiconductor device according to the first or second embodiment to which the IGBT is applied as a semiconductor chip.

As shown in FIG. 34, the three-phase AC inverter 140A includes a gate drive unit 150A, a semiconductor device unit 152A connected to the gate drive unit 150A, and a three-phase AC motor unit 154A. U-phase, V-phase, and W-phase inverters are respectively connected to the three-phase AC motor unit 154A so as to correspond to U-phase, V-phase, and W-phase of the three-phase AC motor unit 154A, in the semiconductor device unit 152A. In this case, the gate drive unit 150A is connected to the IGBTs Q1, Q4, IGBTs Q2, Q5, and the IGBTs Q3, Q6.

The semiconductor device unit 152A includes the IGBTs Q1, Q4, and Q2, Q5, and Q3, Q6 having inverter configurations connected between a positive terminal (+) and a negative terminal (−) of the converter 148A to which a storage battery (E) 146A is connected. Furthermore, flywheel diodes D1-D6 are respectively connected reversely in parallel between the emitter and the collector of the IGBTs Q1-Q6.

The semiconductor device or the power module according to the embodiments can be formed as any one selected from the group consist of 1-in-1 module, 2-in-1 module, 4-in-1 module, 6-in-1 module, and 7-in-1 module.

According to the embodiments, there can be provided the semiconductor device capable of improving the power cycle capability, the power module, and the fabrication method of such a semiconductor device.

OTHER EMBODIMENTS

As explained above, the embodiments have been described, as a disclosure including associated description and drawings to be construed as illustrative, not restrictive. This disclosure makes clear a variety of alternative embodiments, working examples, and operational techniques for those skilled in the art.

Such being the case, the embodiments cover a variety of embodiments, whether described or not.

INDUSTRIAL APPLICABILITY

The semiconductor device and the power module according to the embodiments can be used for manufacturing techniques of semiconductor modules, e.g. IGBT modules, diode modules, and MOS modules (Si, SiC, GaN), and can be applied to wide applicable fields, e.g. inverters used for HEV/EV, inverters and converters used for industrial equipment.

What is claimed is:

1. A semiconductor device comprising:
   a semiconductor chip on which first and second electrodes are formed on a front surface side and a third electrode is formed on a back surface side of the semiconductor chip, the semiconductor chip comprising a transistor;
   an insulating film formed to cover a front surface of the semiconductor chip, the first electrode being disposed on a surface of the insulating film, the transistor being formed below a position where the first electrode is disposed, the insulating film being formed so as to be interposed between the first electrode and the transistor;
   a metal layer formed so as to cover at least a part of a front side surface of the first electrode; and
   a bonding wire connected on the front side surface of the first electrode, wherein
   an area of the first electrode is larger than an area of the second electrode.

2. The semiconductor device according to claim 1, wherein
   the bonding wire comprising a copper wire.

3. The semiconductor device according to claim 1, wherein
   a plurality of the bonding wires are connected on the front side surface of the first electrode.

4. The semiconductor device according to claim 1, wherein
   the first electrode includes a concave portion and a part of the second electrode is inserted into the concave portion.

5. The semiconductor device according to claim 1, wherein
   a thickness of the metal layer is within a range from 10 μm to 100 μm.

6. The semiconductor device according to claim 1, wherein
the semiconductor chip is based on an SiC.

7. The semiconductor device according to claim 1, wherein
the semiconductor chip is disposed on a first substrate.

8. The semiconductor device according to claim 1, wherein
one end of the bonding wire is bonded onto the metal layer.

9. The semiconductor device according to claim 8, wherein
the bonding wire comprising a copper wire, an aluminum wire, or a clad wire, and
the one end of the bonding wire is bonded thereto by means of an ultrasonic wave.

10. The semiconductor device according to claim 8, wherein
the other end of the bonding wire is connected to a second substrate.

11. The semiconductor device according to claim 1, wherein
the metal layer is a fired layer.

12. The semiconductor device according to claim 11, wherein
the fired layer comprises a silver fired layer.

13. The semiconductor device according to claim 11, wherein
the fired layer comprises a copper fired layer.

14. The semiconductor device according to claim 1, further comprising:
a thin film for coating electrode surface disposed between the first electrode and the metal layer, the thin film for coating electrode surface comprising one film selected from the group consisting of a gold thin film, a silver thin film and a palladium thin film.

15. The semiconductor device according to claim 1, wherein
the semiconductor chip comprises a metal-insulator-semiconductor field-effect transistor, and
the first electrode disposed on the semiconductor chip comprises a source pad electrode.

16. The semiconductor device according to claim 1, wherein
the semiconductor chip comprises a wide-bandgap type semiconductor.

17. The semiconductor device according to claim 1, wherein
the semiconductor chip is provided with a $\Delta Tj$-power cycle of not less than 100° C.

* * * * *